US010283601B2

(12) United States Patent
Balakrishnan et al.

(10) Patent No.: US 10,283,601 B2
(45) Date of Patent: May 7, 2019

(54) STRAINED SILICON GERMANIUM FIN WITH BLOCK SOURCE/DRAIN EPITAXY AND IMPROVED OVERLAY CAPACITANCE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/467,801

(22) Filed: Mar. 23, 2017

(65) Prior Publication Data
US 2017/0221993 A1    Aug. 3, 2017

Related U.S. Application Data

(62) Division of application No. 15/012,968, filed on Feb. 2, 2016, now Pat. No. 9,614,040.

(51) Int. Cl.
*H01L 29/66* (2006.01)
*H01L 29/417* (2006.01)
(Continued)

(52) U.S. Cl.
CPC .. *H01L 29/41783* (2013.01); *H01L 21/02532* (2013.01); *H01L 21/02636* (2013.01); *H01L 21/283* (2013.01); *H01L 29/165* (2013.01); *H01L 29/42364* (2013.01); *H01L 29/6681* (2013.01); *H01L 29/66545* (2013.01); *H01L 29/66795* (2013.01); *H01L 29/785* (2013.01); *H01L 29/7848* (2013.01)

(58) Field of Classification Search
CPC . H01L 29/0649; H01L 29/1054; H01L 29/16; H01L 29/41791; H01L 29/42376; H01L 29/66553; H01L 29/66795; H01L 29/7849; H01L 29/785; H01L 29/41783; H01L 29/7848
USPC ........................................................ 257/192
See application file for complete search history.

(56) References Cited

U.S. PATENT DOCUMENTS 7,642,578 B2    1/2010  Lee et al.
7,820,513 B2 *  10/2010  Hareland .......... H01L 29/42384
                                                          257/E21.415
(Continued)

FOREIGN PATENT DOCUMENTS

CN    103972107 A    8/2014

OTHER PUBLICATIONS

List of IBM Patents or Patent Applications Treated as Related Dated Mar. 23, 2017, 2 Pages.

*Primary Examiner* — Jay C Kim
(74) *Attorney, Agent, or Firm* — Scully, Scott, Murphy & Presser, P.C.; L. Jeffrey Kelly, Esq.

(57) ABSTRACT

A semiconductor structure is provided including a strained silicon germanium alloy fin that can be employed as a channel material for a FinFET device and having a gate spacer including a lower portion that fills in a undercut region that lies adjacent to the strained silicon germanium alloy fin and beneath raised source/drain (S/D) structures and silicon pedestal structures that can provide improved overlay capacitance.

12 Claims, 16 Drawing Sheets

(51) Int. Cl.
*H01L 29/78* (2006.01)
*H01L 21/02* (2006.01)
*H01L 21/283* (2006.01)
*H01L 29/165* (2006.01)
*H01L 29/423* (2006.01)

(56) References Cited

U.S. PATENT DOCUMENTS

| | | |
|---|---|---|
| 7,851,790 B2 | 12/2010 | Rachmady et al. |
| 7,892,945 B2 | 2/2011 | Bedell et al. |
| 8,084,308 B2 | 12/2011 | Chang et al. |
| 8,384,069 B2 | 2/2013 | Pernel et al. |
| 8,420,471 B2 | 4/2013 | Anderson et al. |
| 8,530,932 B2 | 9/2013 | Chang et al. |
| 8,623,728 B2 * | 1/2014 | Chang ............... H01L 29/161 438/285 |
| 8,753,942 B2 | 6/2014 | Kuhn et al. |
| 8,937,299 B2 | 1/2015 | Basu et al. |
| 8,975,168 B2 | 3/2015 | Liu et al. |
| 8,987,794 B2 | 3/2015 | Rachmady et al. |
| 9,012,284 B2 | 4/2015 | Glass et al. |
| 9,024,364 B2 | 5/2015 | Okano |
| 9,029,835 B2 | 5/2015 | Chu-King et al. |
| 9,093,533 B2 | 7/2015 | Cheng et al. |
| 9,184,269 B2 | 11/2015 | Ching et al. |
| 9,257,545 B2 | 2/2016 | Leobandung |
| 9,362,179 B1 * | 6/2016 | Cheng ............ H01L 21/823821 |
| 9,391,077 B2 | 7/2016 | Cheng et al. |
| 9,412,849 B1 | 8/2016 | Suk et al. |
| 9,425,212 B2 * | 8/2016 | Cappellani .......... H01L 27/1207 |
| 9,577,100 B2 * | 2/2017 | Cheng ................ H01L 29/7851 |
| 2012/0049294 A1 | 3/2012 | Chen et al. |
| 2014/0151639 A1 * | 6/2014 | Chang ............... H01L 29/42392 257/27 |
| 2014/0175379 A1 | 6/2014 | Chu-Kung et al. |
| 2014/0264607 A1 | 9/2014 | Basu et al. |
| 2014/0353767 A1 | 12/2014 | Liu et al. |
| 2014/0357060 A1 | 12/2014 | Liu et al. |

* cited by examiner

STRAINED SILICON GERMANIUM FIN WITH BLOCK SOURCE/DRAIN EPITAXY AND IMPROVED OVERLAY CAPACITANCE

BACKGROUND

The present application relates to a semiconductor structure and a method of forming the same. More particularly, the present application relates to a semiconductor structure including a strained silicon germanium alloy fin that can be employed as a channel material for a FinFET device and having improved overlay capacitance. The present application also provides a method for forming such a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

In order to extend FinFET devices beyond the current technology node, there is a need to boost the performance by using high mobility channel materials such as, for example, strained silicon germanium (SiGe). In current SiGe FinFETs, the SiGe fins suffer from strain relaxation do to cutting the SiGe fins to a desired length. In such instances, the strain relaxes, especially at the end portions of the SiGe fins. Short SiGe fins are even more prone to the effect of strain relaxation. There is thus a need for providing a structure and method to maintain strain in SiGe fins.

SUMMARY

A semiconductor structure is provided including a strained silicon germanium alloy fin that can be employed as a channel material for a FinFET device and having a gate spacer including a lower portion that fills in a undercut region that lies adjacent to the strained silicon germanium alloy fin and beneath raised source/drain (S/D) structures and silicon pedestal structures that can provide improved overlay capacitance.

In one aspect of the present application, a semiconductor structure is provided. In one embodiment of the present application, the semiconductor structure of the present application includes a functional gate structure straddling over a first portion of at least one strained silicon germanium alloy fin. A source region is located on one side of the functional gate structure and comprises, a first end portion of the at least one strained silicon germanium alloy fin, and silicon pedestal structures located on opposing sidewalls of the first end portion of the at least one strained silicon germanium alloy fin. A drain region is located on another side of the functional gate structure and comprises a second end portion of the at least one strained silicon germanium alloy fin, and silicon pedestal structures located on opposing sidewalls of the second end portion of the at least one strained silicon germanium alloy fin. A raised source/drain (S/D) structure is present over each of the silicon pedestal structures, and the first and second end portions of the silicon germanium alloy fins, wherein each of the raised silicon raised source/drain (S/D) structures has a sidewall surface that overhangs a sidewall surface of each silicon pedestal structure. A gate spacer is located on opposing sidewalls of the functional gate structure and separates the functional gate structure from the source region and the drain region, wherein the gate spacer has a first region that is located on the at least one strained silicon germanium alloy fin, and the gate spacer has second regions that are present adjacent the at least one strained silicon germanium alloy fin and that have an upper portion and a lower portion, the lower portion of the gate spacer fills an undercut region beneath the overhang.

In another aspect of the present application, a method of forming a semiconductor structure is provided. In one embodiment of the present application, the method of the present application includes forming a structure containing at least one silicon germanium alloy fin having silicon pedestals located on opposing sidewalls of the at least one silicon germanium alloy fin. A sacrificial gate structure and a dielectric spacer are formed over a first portion of the at least one silicon germanium alloy fin and a first portion of each silicon pedestal. Next, a raised source/drain (S/D) structure and an interlevel dielectric layer are formed sequentially on exposed portions of the at least one silicon germanium alloy fin and the silicon pedestals not covered by the sacrificial gate structure and the dielectric spacer. The sacrificial gate structure is then removed to expose at least the first portion of the silicon pedestals. The first portion of each silicon pedestal is removed, while maintaining a silicon pedestal portion beneath the raised source/drain structure and the interlevel dielectric layer. A sidewall of each silicon pedestal portion is then etched into to provide silicon pedestal structures, wherein the raised source/drain structure and the interlevel dielectric layer overhang each silicon pedestal structure. A gate spacer is then formed, wherein the gate spacer has a first region that is located on the first portion of the at least one strained silicon germanium alloy fin, and the gate spacer has second regions that are present adjacent the first portion of the at least one strained silicon germanium alloy fin that have an upper portion and a lower portion, the lower portion of the gate spacer fills an undercut region beneath the overhang.

DETAILED DESCRIPTION

Figure 1:
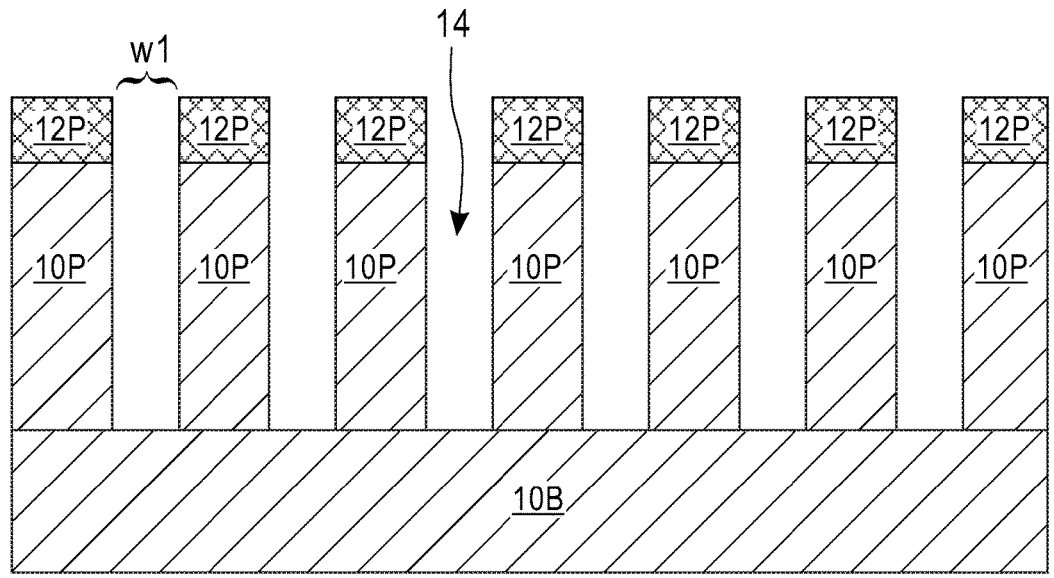
FIG. 1 is a cross sectional view of an exemplary semiconductor structure including a plurality of silicon pedestals extending upwards from a surface of a substrate, wherein a first hard mask cap is located on each silicon pedestal that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a plurality of silicon pedestals 10P extending upwards from a surface of a substrate 10B, wherein a first hard mask cap 12P is located on each silicon pedestal 10P that can be employed in accordance with an embodiment of the present application. Each silicon pedestal 10P is separated by a gap 14 having a width w1; w1 may be referred to herein as first width. Width, w1, of each gap 14 provides the width of each strained silicon germanium alloy fin to be subsequently formed. In one embodiment, width, w1, of each gap 14 is from 4 nm to 30 nm. Other widths that are lesser than, or greater than, the aforementioned width range can also be used as width, w1, of each gap 14.

The exemplary semiconductor structure shown in FIG. 1 can be formed by first providing one of a bulk silicon substrate (i.e., a semiconductor substrate entirely composed of silicon), a multilayered semiconductor substrate in which the uppermost portion of the multilayered semiconductor substrate is composed of silicon, or a silicon-on-insulator (SOI) substrate in which the topmost layer of the SOI substrate is composed of silicon. The silicon present in any of the instances is single crystalline and may have any of the well known crystal orientations. For example, the crystal orientation of the bulk semiconductor substrate may be {100}, {110} or {111}.

Next, a first hard mask layer is formed on one of the above mentioned substrates. The first hard mask layer that is present on the surface of one of the above mentioned substrates is a contiguous hard mask material that covers the entirety of the substrate. The first hard mask layer that is employed in the present application may include an oxide, a nitride and/or an oxynitride. In one embodiment, the hard mask material that can be used in providing the first hard mask layer can be comprised of silicon dioxide. In another embodiment, the hard mask material that can be used in providing the first hard mask layer can be comprised of silicon nitride. In yet another embodiment, the hard mask material that can be used in providing the first hard mask layer can be a stack comprised of, in any order, silicon dioxide and silicon nitride.

In some embodiments, the hard mask material that can be used in providing the first hard mask layer can be formed by a deposition process such as, for example, chemical vapor deposition (CVD) or plasma enhanced chemical vapor deposition (PECVD). In other embodiments, the hard mask material that can be used in providing the first hard mask layer can be formed by a thermal process such as, for example, thermal oxidation and/or thermal nitridation. In yet other embodiments, the hard mask material that can be used in providing the first hard mask layer can be formed by a combination of a deposition process and a thermal process. The thickness of the hard mask material that can be used in providing the first hard mask layer can range from 10 nm to 40 nm. Other thicknesses that are lesser than, or greater than, the aforementioned thickness range may also be employed as the thickness of the first hard mask layer.

After providing the hard mask layer on one of the above mentioned substrates, the hard mask layer and the upper silicon layer or silicon portion of the substrate is patterned. In one embodiment of the present application, the patterning may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In one embodiment of the present application, the etch stops on a sub-surface of a bulk semiconductor substrate.

In one embodiment of the present application, the substrate 10B is a remaining portion of a bulk silicon substrate. In another embodiment and when an SOI substrate is employed, the substrate 10B may include, from bottom to top, a handle substrate (e.g., a semiconductor material such as silicon), an insulator layer (e.g., a buried oxide) and a thin lower portion of a topmost silicon layer. In yet a further embodiment of the present and when a multilayered semiconductor substrate is employed, the remaining portion of the substrate 10B may include remaining semiconductor layers of the multilayered semiconductor substrate.

Each silicon pedestal 10P that is formed can have height from 30 nm to 120 nm, and a width from 20 nm to 120 nm. Other heights and widths that are lesser than, or greater than, the aforementioned ranges may also be employed in the present application. As is shown, the sidewall surfaces of each first hard mask cap 12P are vertically aligned with the sidewall surfaces of one of the underlying silicon pedestals 10P.

Figure 2:
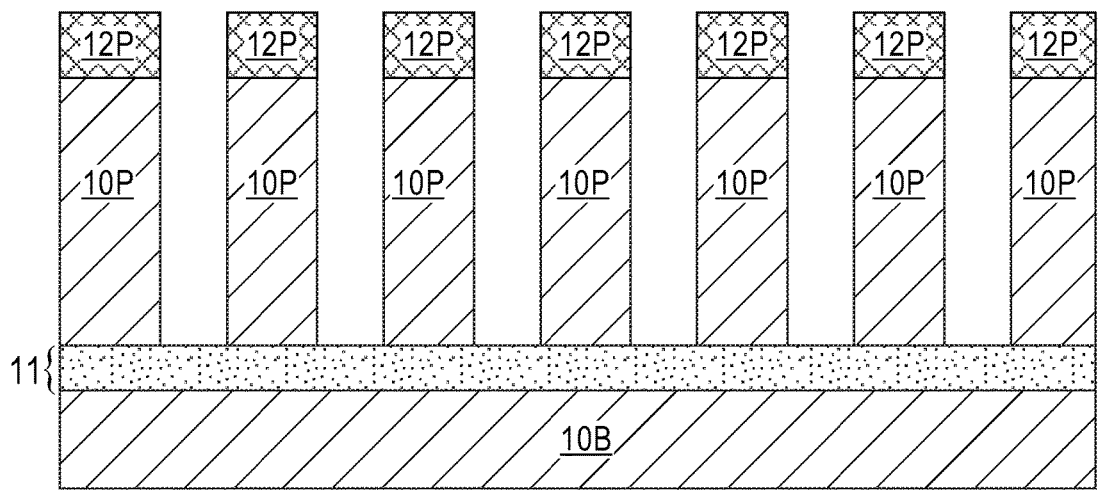
FIG. 2 is a cross sectional view of the exemplary semiconductor structure of FIG. 1 after forming a dopant region within a topmost semiconductor material portion of the substrate.

Referring now to FIG. 2, there is illustrated the exemplary semiconductor structure of FIG. 1 after forming a dopant region 11 within an upper semiconductor material portion of the substrate 10B. In some embodiments of the present application, the step of forming the dopant region 11 within the upper semiconductor material portion of substrate 10B may be omitted.

In one embodiment, the upper semiconductor material portion in which the dopant region 11 can be formed is composed of silicon or one of the semiconductor materials that provides the multilayered semiconductor substrate. The dopant region 11 can be formed utilizing ion implantation, followed by an activation anneal.

The dopant region 11 may contain a p-type dopant or an n-type dopant. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In one embodiment of the present application, the concentration of dopant within dopant region 11 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived. In one embodiment, the dopant region 11 may be uniform (i.e., have a uniform distribution of dopants throughout the entire region). In another embodiment, the dopant region 11 may be graded. In such an embodiment, the dopant concentration may decrease downwards from the substrate 10B/silicon pedestal 10P interface. The dopant region 11 is oppositely doped to the later formed source/drain region so as to act as a punch through stop layer. The depth of dopant region 11 may range from 30 nm to 70 nm below the topmost surface of substrate 10B.

Figure 3:
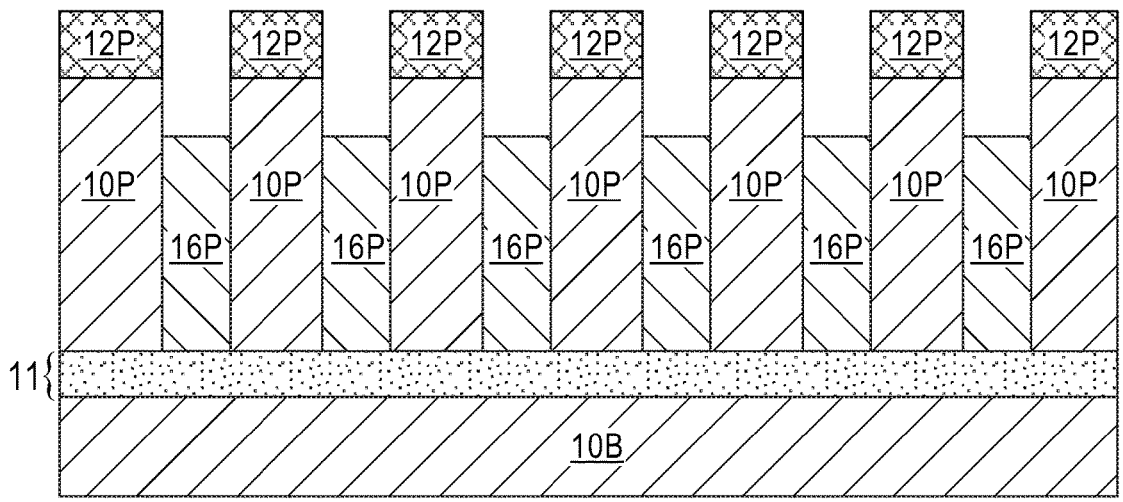
FIG. 3 is a cross sectional view of the exemplary semiconductor structure of FIG. 2 after epitaxally growing a strained silicon germanium alloy fin within a gap located between each silicon pedestal.

Referring now to FIG. 3, there is illustrated the exemplary semiconductor structure of FIG. 2 after epitaxally growing a strained silicon germanium alloy fin 16P within each gap 14 located between each silicon pedestal 10P. Each strained silicon germanium alloy fin 16P has a bottommost surface that directly contacts a topmost semiconductor material portion of substrate 10B. Each strained silicon germanium alloy fin 16P has a topmost surface that is less than the topmost surface of each silicon pedestal 10P. Thus, each strained silicon germanium alloy fin 16P has a height that is less than a height of each silicon pedestal 10P. In one example, each strained silicon germanium alloy fin 16P has a height from 10 nm to 80 nm. Each strained silicon germanium alloy fin 16P completely fills one of the gaps 14. Hence, each strained silicon germanium alloy fin 16P has the width, w1, mentioned above for gap 14. In accordance with the present, each strained silicon germanium alloy fin 16P contains a silicon pedestal 10P located on opposing sidewalls thereof. The strained silicon germanium alloy fins 16P and the silicon pedestal 10P have a same length at this point of the present application.

Each strained silicon germanium alloy fin 16P may have a germanium content from 20 atomic percent germanium to 60 atomic percent germanium. Other germanium contents that are lesser than, or greater than the aforementioned range may also be employed in the present application.

As mentioned above, each strained silicon germanium alloy fin 16P is formed by an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing each strained silicon germanium alloy fin 16P, each strained silicon germanium alloy fin 16P has an epitaxial relationship with the upper semiconductor material portion of substrate 10B.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each strained silicon germanium alloy fin 16P can be performed utilizing any well known precursor gas or gas mixture. Carrier gases like hydrogen, nitrogen, helium and argon can be used.

Figure 4:
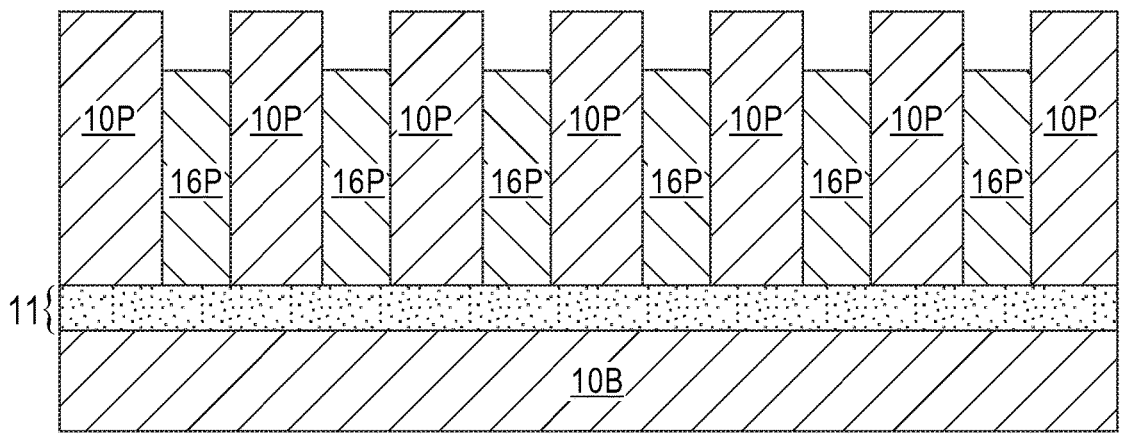
FIG. 4 is a cross sectional view of the exemplary semiconductor structure of FIG. 3 after removing each first hard mask cap from each silicon pedestal.

Referring now to FIG. 4, there is illustrated the exemplary semiconductor structure of FIG. 3 after removing each first hard mask cap 12P from the silicon pedestals 10P. Each first hard mask cap 12P can be removed utilizing an etching process that is selective in removing the first hard mask material relative to the strained silicon germanium alloy fins 16P and the silicon pedestals 10P. In one embodiment of the present application, a reactive ion etch can be used to remove each of the first hard mask caps 12P from atop each of the silicon pedestals 10P. After removing the first hard mask caps 12P, a topmost surface of each silicon pedestal 10P is exposed.

Figure 5:
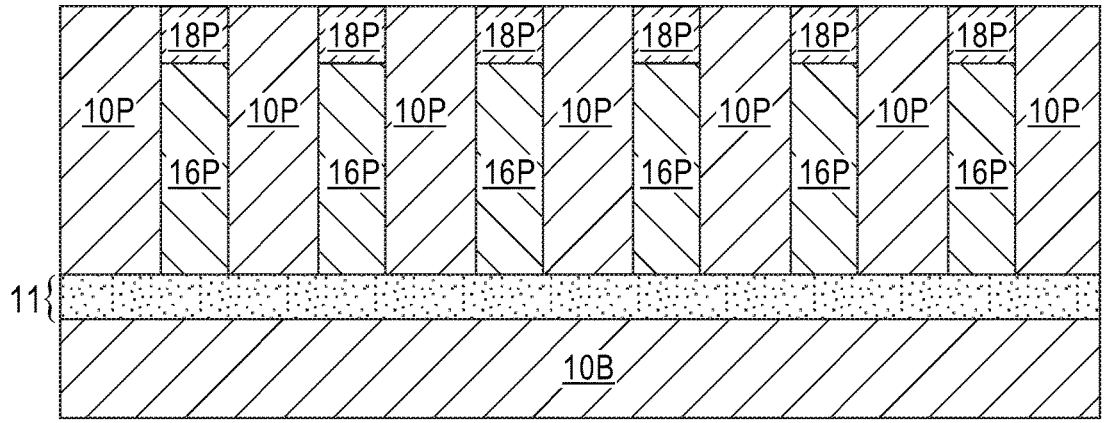
FIG. 5 is a cross sectional view of the exemplary semiconductor structure of FIG. 4 after forming a second hard mask cap on each strained silicon germanium alloy fin.

Referring now to FIG. 5, there is illustrated the exemplary semiconductor structure of FIG. 4 after forming a second hard mask cap 18P on each strained silicon germanium alloy fin 16P. Each second hard mask cap 18P can be formed utilizing one of the hard mask materials mentioned above for the first hard mask layer that provided each first hard mask cap 12P. Each second hard mask cap 18P can be formed by first providing a second hard mask layer utilizing one of the techniques mentioned above in forming the first hard mask layer. After providing the second hard mask layer, a planarization process such as, for example, chemical mechanical polishing, can be used to provide each second hard mask cap 18P. Each second hard mask cap 18P has a bottommost surface that directly contacts a topmost surface of a strained silicon germanium alloy fin 16P. Each second hard mask cap 18P that is formed has a topmost surface that is coplanar with a topmost surface of each silicon pedestal 10P. Also, the width of each second hard mask cap 18P is equal to the w1 mentioned above for gap 14.

Figure 6:
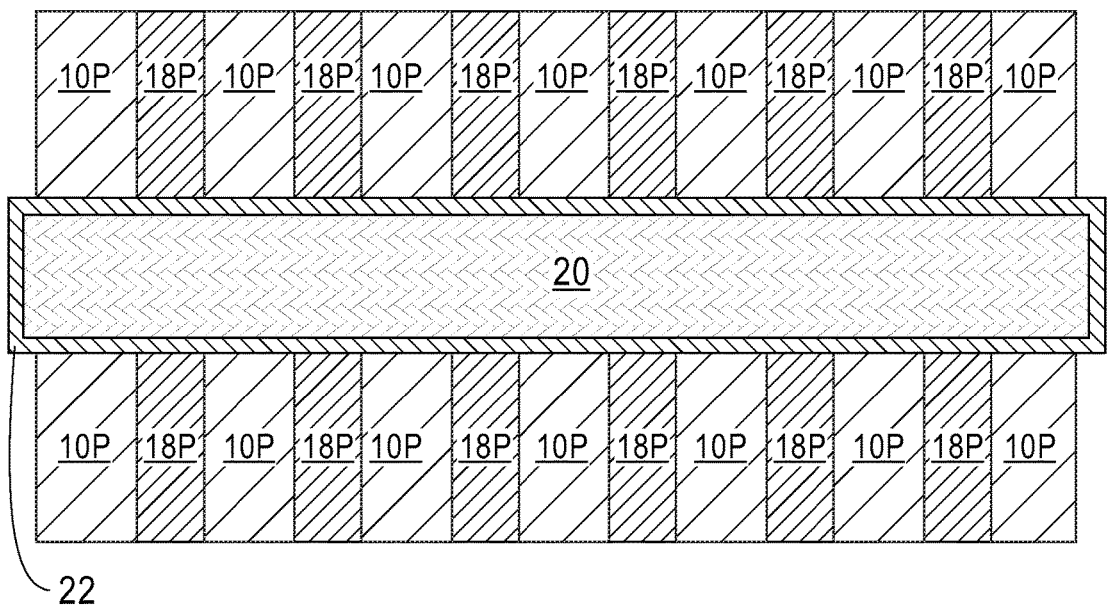
FIG. 6 is a top down view of the exemplary semiconductor structure of FIG. 5 after forming a sacrificial gate structure and a dielectric spacer.

Referring now to FIG. 6, there is illustrated the exemplary semiconductor structure of FIG. 5 after forming a sacrificial gate structure 20 and a dielectric spacer 22. As is shown the dielectric spacer 22 surrounds the sacrificial gate structure 20. Although a single sacrificial gate structure 20 and a single dielectric spacer 22 are described and illustrated, a plurality of sacrificial gate structures and a plurality of dielectric spacers can be formed. The sacrificial gate structure 20 and dielectric spacer 22 cover a first portion (i.e., channel region) of each strained silicon germanium alloy fin 16P and each silicon pedestal 10P, while leaving end portions of each strained silicon germanium alloy fin 16P and end portions of each silicon pedestal 10P exposed for further processing. The ends portions of the strained silicon germanium alloy fins 18P and each silicon pedestal 10P are located in the S/D regions of the exemplary semiconductor structure of the present application.

The sacrificial gate structure 20 may include a single sacrificial material layer or a stack of two or more sacrificial materials (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the sacrificial gate structure 20. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 20, a dielectric spacer 22 can be formed on exposed sidewall surfaces of the sacrificial gate structure 20. Dielectric spacer 22 can be formed by first providing a dielectric spacer material and then etching the dielectric spacer material. Examples of dielectric spacer materials that may be employed in the present application include dielectric oxides, dielectric nitrides and/or dielectric oxynitrides. In one embodiment, the dielectric spacer material used in providing dielectric spacer 22 is composed of silicon dioxide or silicon nitride. The dielectric spacer material may be provided by a deposition process including, for example, chemical vapor deposition (CVD), plasma enhanced chemical vapor deposition (PECVD), or physical vapor deposition (PVP). The etch used to provide the dielectric spacer may comprise a dry etching process such as, for example, reactive ion etching.

Figure 7:
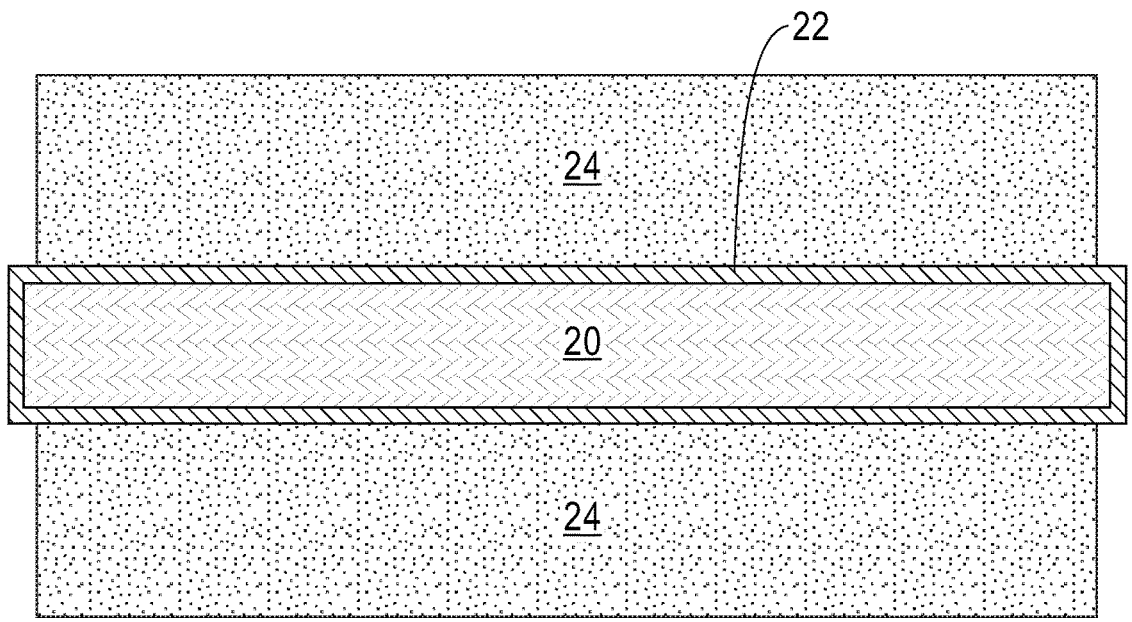
FIG. 7 is a top down view of the exemplary semiconductor structure of FIG. 6 after removing exposed portions of each second hard mask not covered by the sacrificial gate structure and the dielectric spacer, and forming a raised source/drain (S/D) structure on exposed portions of each silicon pedestal and each strained silicon germanium alloy fin and one opposing sides of the sacrificial gate structure.

Referring now to FIG. 7, there is illustrated the exemplary semiconductor structure of FIG. 6 after removing exposed portions of each second hard mask 18P not covered by the sacrificial gate structure 20 and the dielectric spacer 22, and forming a raised source/drain (S/D) structure 24 on exposed portions of each silicon pedestal 10P and each strained silicon germanium alloy fin 16P and one opposing sides of the sacrificial gate structure 20. As is known to those skilled in the art, the raised source/drain (S/D) structure 24 formed on one side of the sacrificial gate structure is within a source region of the exemplary semiconductor structure, while the raised source/drain (S/D) structure 24 formed on the other side of the sacrificial gate structure is within a drain region of the exemplary semiconductor structure.

Each raised source/drain (S/D) structure 24 that is formed includes a semiconductor material having semiconductor properties and either a-type dopant or an n-type dopant, as defined above. The semiconductor material that provides each raised source/drain (S/D) structure 24 may include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, each raised source/drain (S/D) structure 24 is entirely composed of silicon or a silicon germanium alloy.

Each raised source/drain (S/D) structure 24 can be formed utilizing an epitaxial growth process, as defined above. In one embodiment, the dopant that is present within each raised source/drain (S/D) structure 24 may be present within the precursor gas that provides each raised source/drain (S/D) structure 24. In another embodiment, the dopant that is present within each raised source/drain (S/D) structure 24 can be introduced into an intrinsic epitaxially deposited semiconductor material by utilizing one of ion implantation or gas phase doping. The dopant concentration within each raised source/drain (S/D) structure 24 can range from $1 \times 10^{20}$ atoms/cm$^3$ to $1 \times 10^{21}$ atoms/cm$^3$, although dopant concentrations greater than $1 \times 10^{21}$ atoms/cm$^3$ or less than $1 \times 10^{20}$ atoms/cm$^3$ are also conceived. The dopant can be uniformly distributed with each raised source/drain structure 24 or the dopant can be present as a gradient in each raised source/drain (S/D) structure 24. In some embodiments of the present application, each raised source/drain (S/D) structure 24 is grown up-ward from 100-crystal planes.

Although not evident from the top down view, each raised source/drain (S/D) structure 24 that is formed has a topmost surface that is located beneath a topmost surface of the sacrificial gate structure 20 and the dielectric spacer 22.

Figure 8:
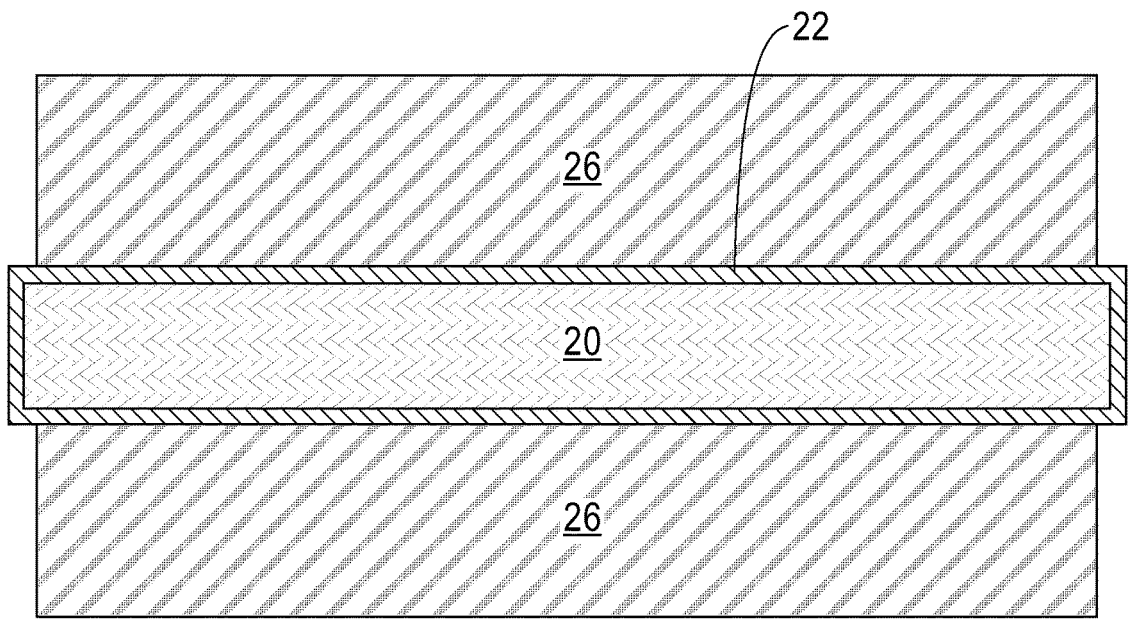
FIG. 8 is a top down view of the exemplary semiconductor structure of FIG. 7 after forming an interlayer dielectric (ILD) layer on each raised S/D structure.

Referring now to FIG. 8, there is illustrated the exemplary semiconductor structure of FIG. 7 after forming an interlayer dielectric (ILD) layer 26 on each raised S/D structure 24. Although not evident from the top down view, each ILD layer 26 that is formed has a topmost surface that is coplanar with a topmost surface of the sacrificial gate structure 20 and the dielectric spacer 22.

Each ILD layer 26 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD layer 26. The use of a self-planarizing dielectric material as the ILD layer 26 may avoid the need to perform a subsequent planarizing step.

In one embodiment, the ILD layer 26 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD layer 26, a planarization process or an etch back process follows the deposition of the dielectric material that provides the ILD layer 26.

Figure 9A:
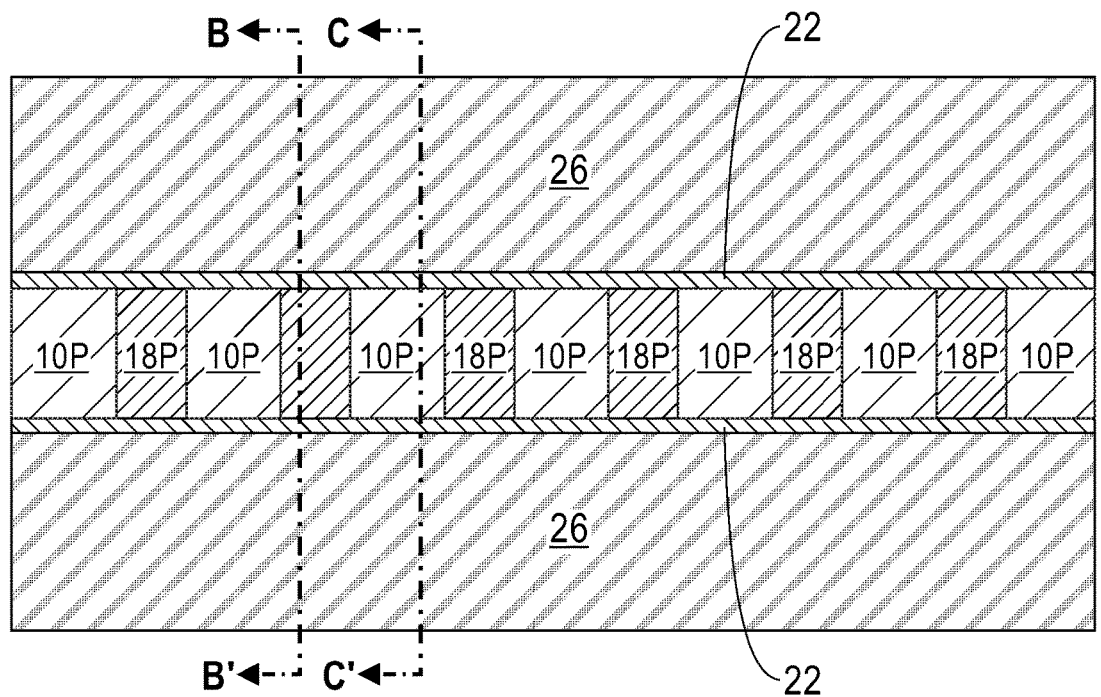
FIG. 9A is a top down view of the exemplary semiconductor structure of FIG. 8 after removing the sacrificial gate structure.
Figure 9B:
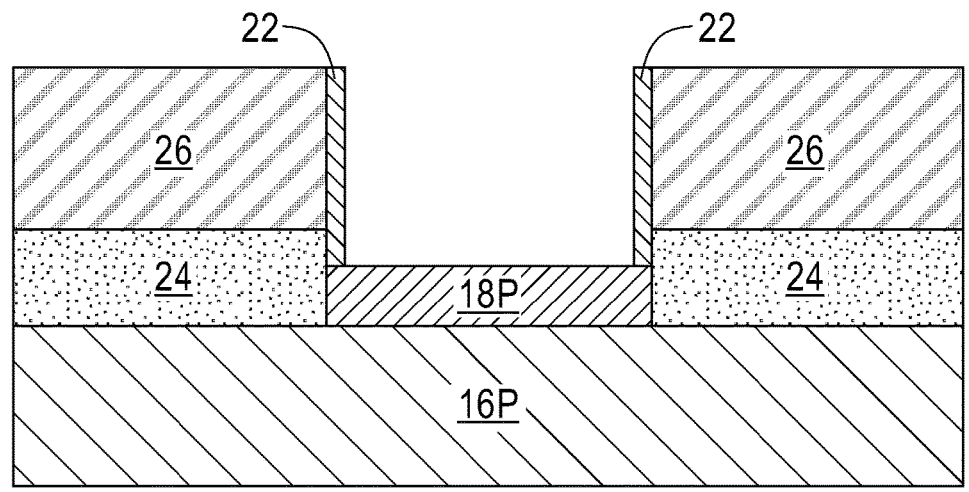
FIG. 9B is a cross sectional view of the exemplary semiconductor structure of FIG. 9A through vertical plane B-B'.
Figure 9C:
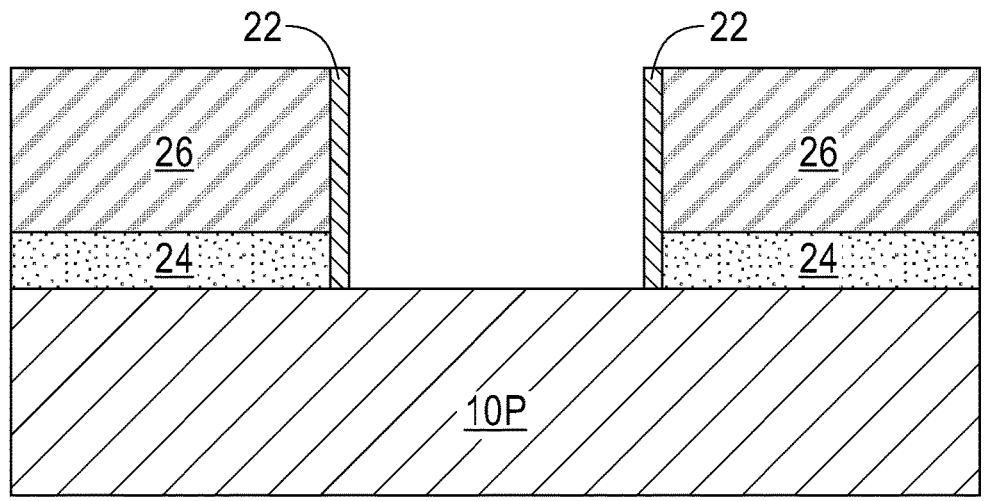
FIG. 9C is a cross sectional view of the exemplary semiconductor structure of FIG. 9A through vertical plan C-C'.

Referring now to FIGS. 9A-9C, there are shown various views of the exemplary semiconductor structure of FIG. 8 after removing the sacrificial gate structure 20; in the drawings the portion of the dielectric spacer 22 that extends beyond the outermost silicon pedestals 10P is not shown for clarity. The sacrificial gate structure 20 may be removed utilizing an etching process such as, for example, reactive ion etching. A single etch or multiple etch processes may be used in removing the sacrificial gate structure 20. A cavity is provided that exposes a topmost surface of each silicon pedestal 10P (See, for example, FIGS. 9A and 9C) and a topmost surface of each second hard mask 18P (See, for example, FIGS. 9A-9B).

Figure 10A:
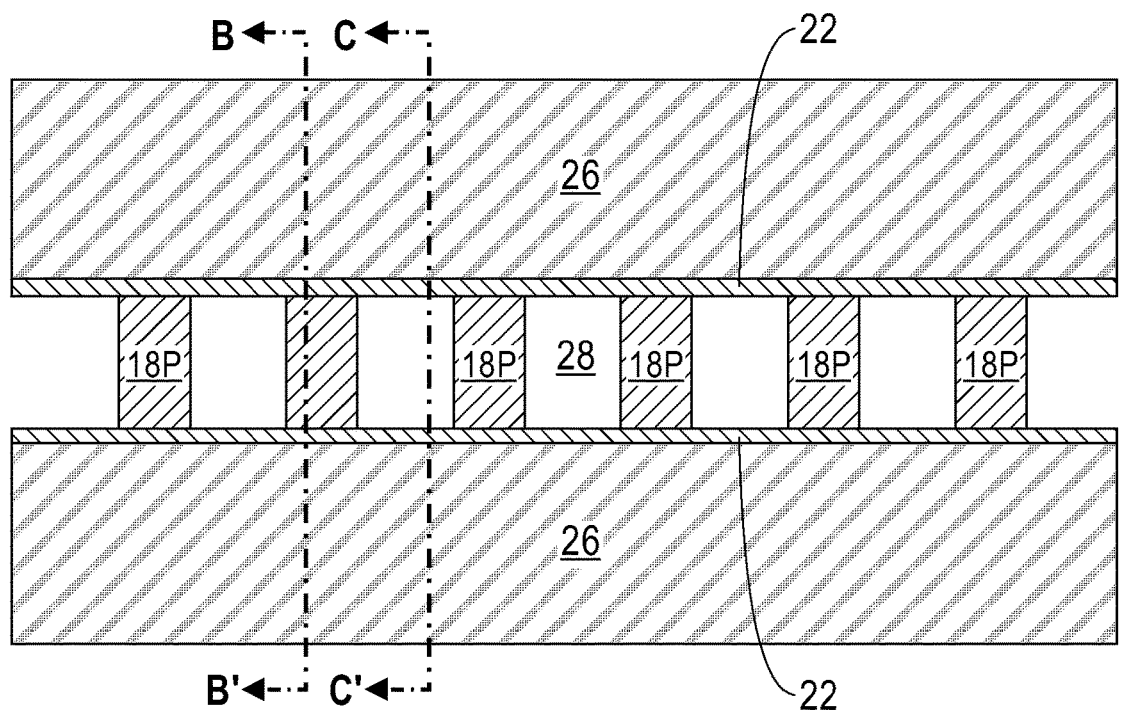
FIG. 10A is a top down view of the exemplary semiconductor structure of FIGS. 9A-9C after removing each exposed silicon pedestal not covered by the ILD layer and the dielectric spacer.
Figure 10B:
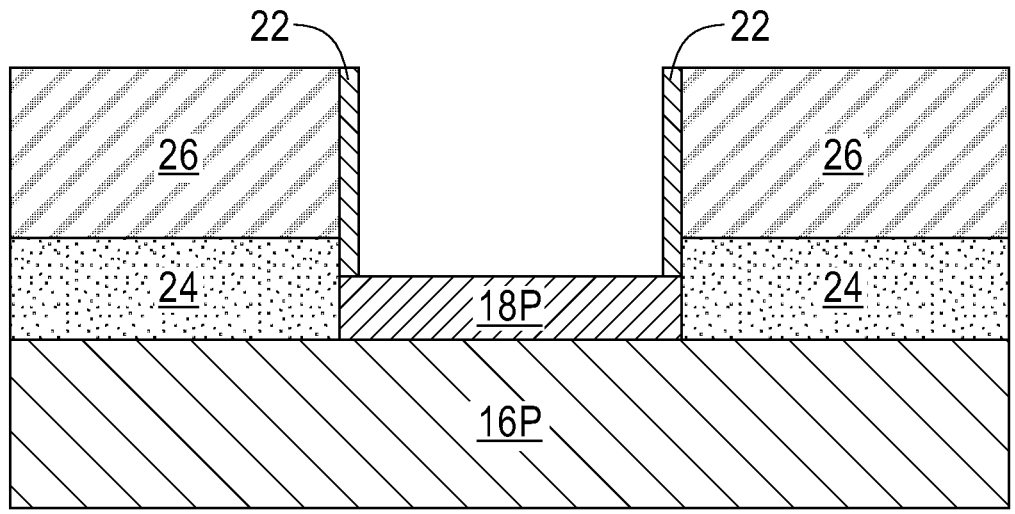
FIG. 10B is a cross sectional view of the exemplary semiconductor structure of FIG. 10A through vertical plane B-B'.
Figure 10C:
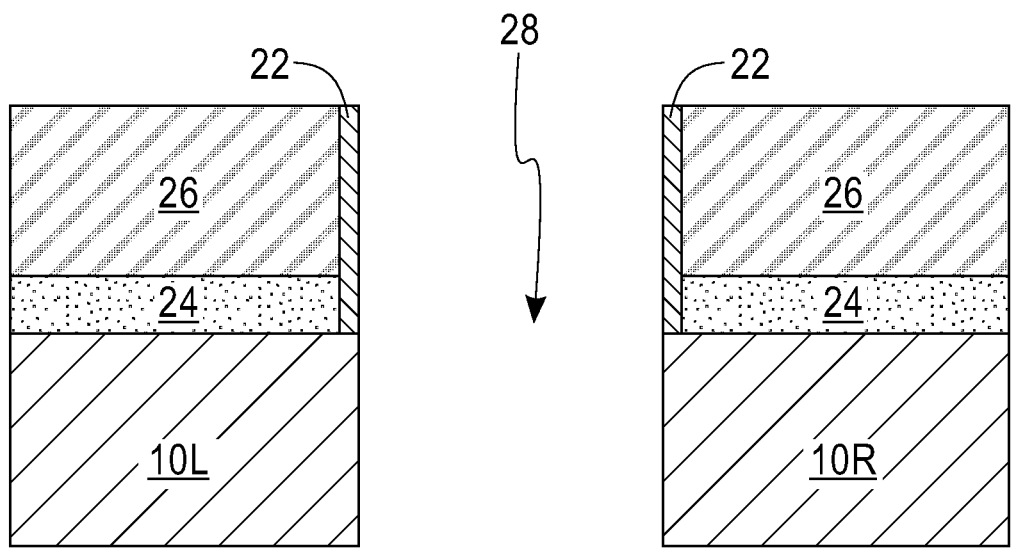
FIG. 10C is a cross sectional view of the exemplary semiconductor structure of FIG. 10A through vertical plan C-C'.

Referring now to FIGS. 10A-10C, there are shown various views of FIGS. 9A-9C after removing each exposed silicon pedestal 10P not covered by the ILD layer 26 and the dielectric spacer 22. Hence, each silicon pedestal 10P is cut into silicon pedestal portions 10L, 10R. One of the silicon pedestal portions (e.g., 10L) can be present in the source region of the exemplary semiconductor structure, while the other of the silicon pedestal portions (e.g., 10R) can be present in the drain region of the exemplary semiconductor structure. Within the cavity mentioned above, an extended cavity 28 is formed that exposes a topmost semiconductor material portion of substrate 10B. The removal (i.e., cutting) of the exposed silicon pedestals 10P not covered by the ILD layer 26 and the dielectric spacer 22 may be performed utilizing an etching process such as, for example, a reactive ion etch. The strained silicon germanium alloy fins 16P that are present in the cavity formed by removing the sacrificial gate structure 20 are not removed since they are protected by the second hard mask cap 18P as shown in FIGS. 10A-10B. Strain within the strained silicon germanium alloy fins 16P is maintained in the present application.

At this point of the present application and as is shown in FIG. 10C, the dielectric spacer 22 has an outermost edge (i.e., sidewall surface) that is vertical aligned with an outermost edge (i.e., sidewall surface) of each silicon pedestal portion (10L, 10R).

Figure 11A:
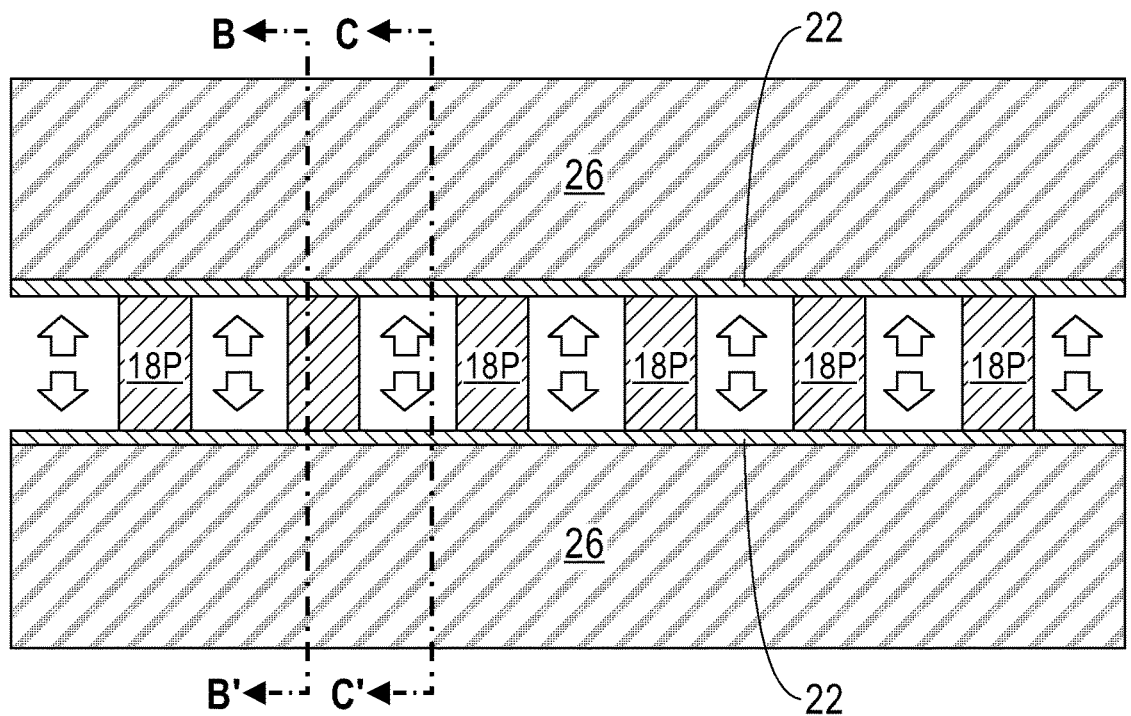
FIG. 11A is a top down view of the exemplary semiconductor structure of FIGS. 10A-10C after etching into a sidewall of each remaining silicon pedestal portion located beneath the dielectric spacer.
Figure 11B:
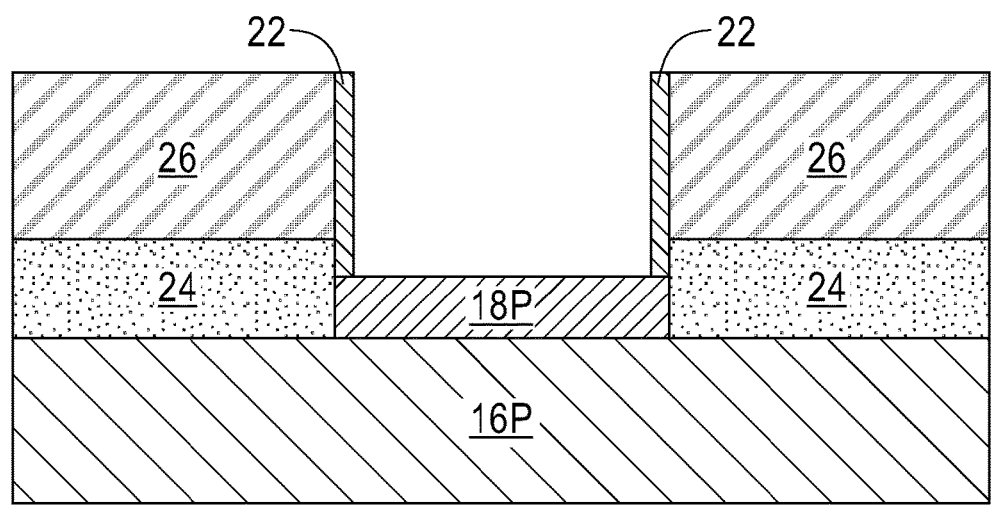
FIG. 11B is a cross sectional view of the exemplary semiconductor structure of FIG. 11A through vertical plane B-B'.
Figure 11C:
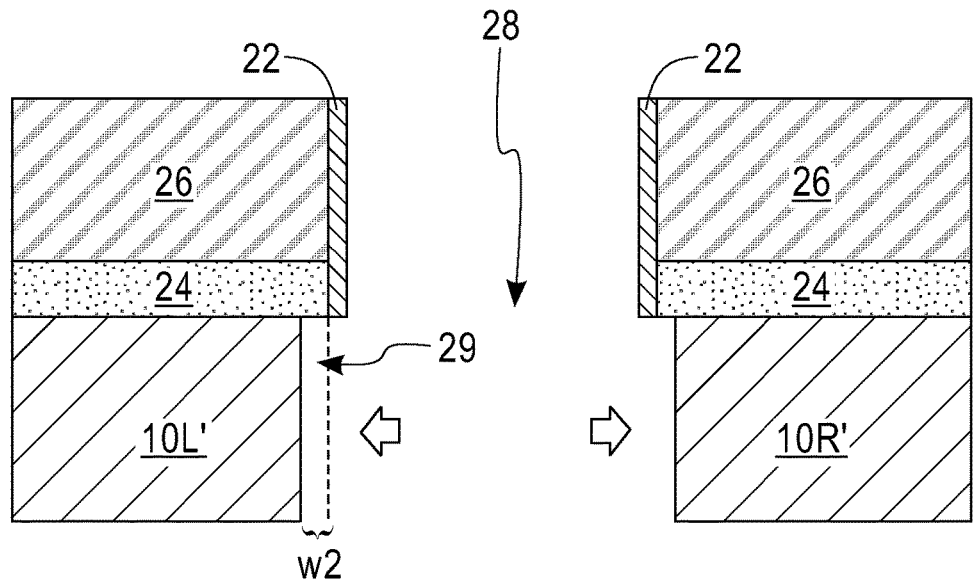
FIG. 11C is a cross sectional view of the exemplary semiconductor structure of FIG. 11A through vertical plan C-C'.

Referring now to FIGS. 11A-11C, there are illustrated various views of the exemplary semiconductor structure of FIGS. 10A-10C after etching into a sidewall of each remaining silicon pedestal 10P (i.e., each silicon pedestal portion 10L, 10R) located beneath the dielectric spacer 22. In FIG. 11A, the arrows show the direction of the etching. After etching, portions of each silicon pedestal portion 10L, 10R remain beneath the ILD layer 26 in both the source region and the drain region. The remaining portions of the silicon pedestal portions 10L, 10R can be referred to herein as silicon pedestal structures 10L', 10R'. As is shown, in FIG. 11C, portions of the raised source/drain (S/D) structure 24 and the ILD layer 26 now overhang the underlying silicon pedestal structure 10L', 10R'. As is shown in FIG. 11C, an undercut region 29 is now formed. The etching used to provide the exemplary semiconductor structure shown in FIGS. 11A-11C comprises a directional etch. In one example, the directional etch may include TMAH (tetramethylammonium hydroxide) as an etchant. In some embodiments, the etch may include an anisotropic selective silicon reaction ion etch. The undercut region 29 may have a width, w2 from 2 nm to 20 nm. The width, w2, of undercut region 29 is measured from an outermost sidewall of the raised source/drain structure 24 to the outermost sidewall of silicon pedestal structures 10L', 10R' within the extended cavity 28.

Figure 12A:
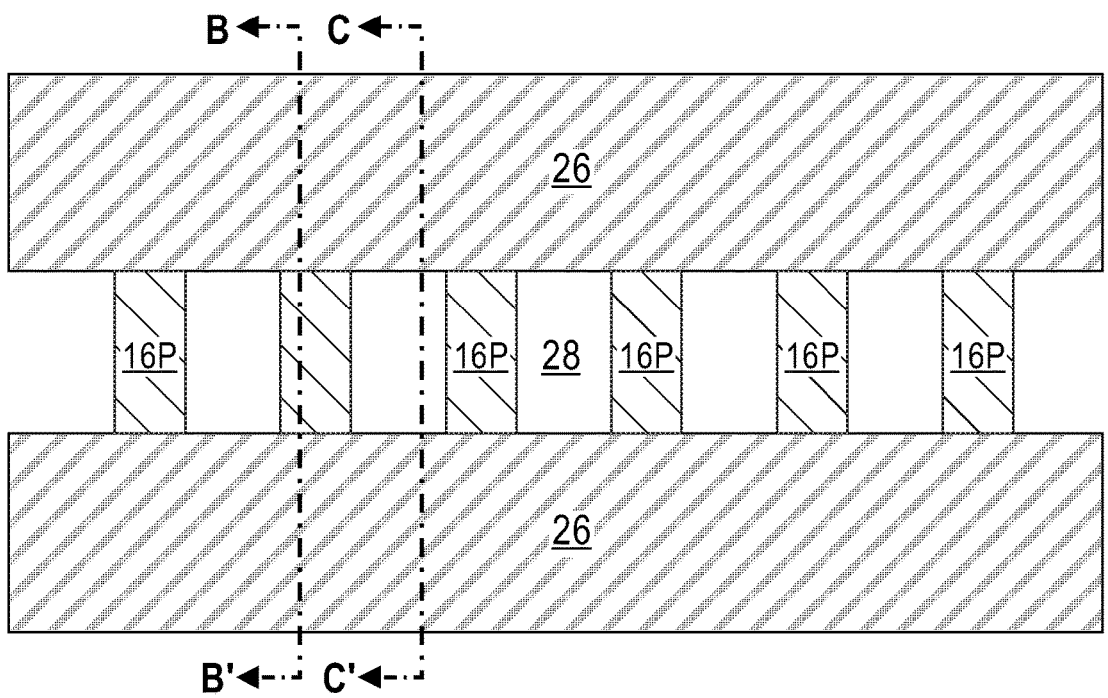
FIG. 12A is a top down view of the exemplary semiconductor structure of FIGS. 11A-11C after removing the dielectric spacer and each second hard mask cap not covered by the ILD layer.
Figure 12B:
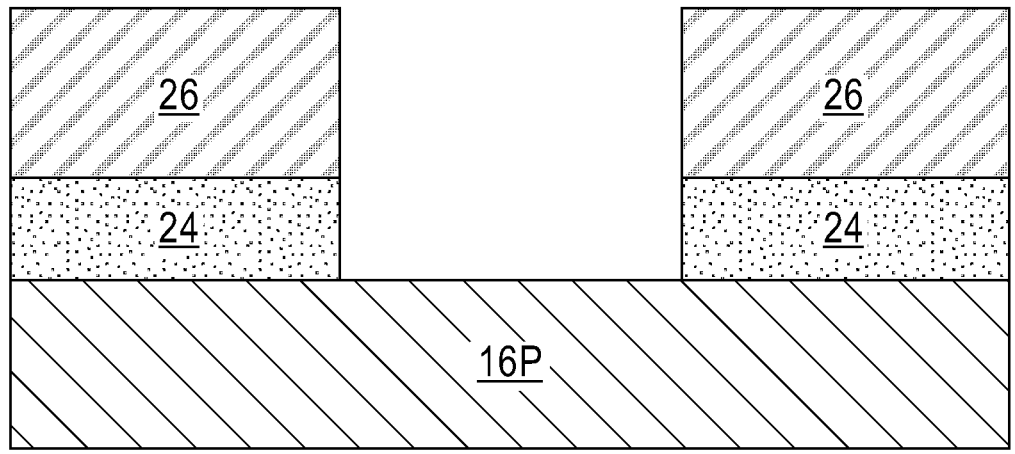
FIG. 12B is a cross sectional view of the exemplary semiconductor structure of FIG. 12A through vertical plane B-B'.
Figure 12C:
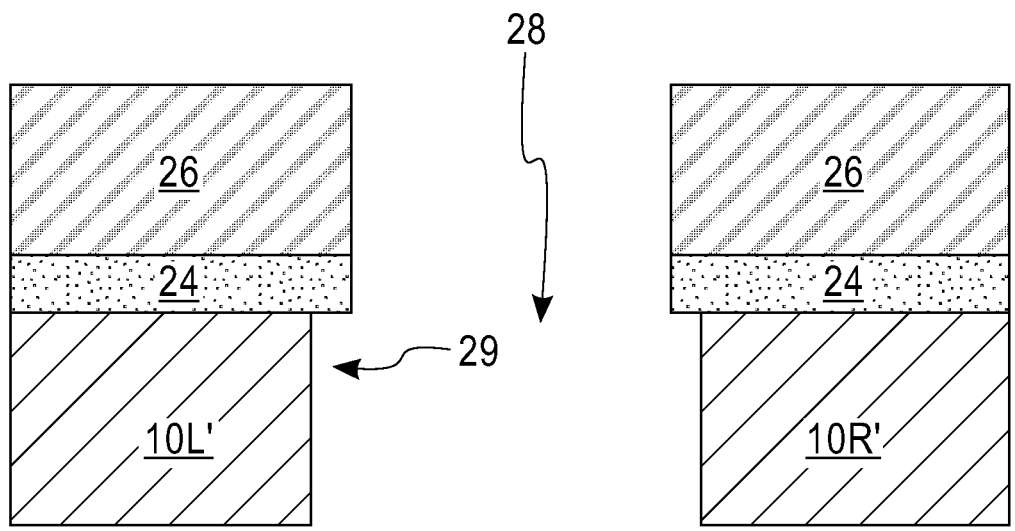
FIG. 12C is a cross sectional view of the exemplary semiconductor structure of FIG. 12A through vertical plan C-C'.

Referring now to FIGS. 12A-12C, there are illustrated various views of the exemplary semiconductor structure of FIGS. 11A-11C after removing the dielectric spacer 22 and each second hard mask cap 18P not covered by the ILD layer 26. The removal of the second hard mask caps 18P exposes topmost surfaces of each strained silicon germanium fin 16P within the cavity that was formed after removing the sacrificial gate structure, while the removal of the dielectric spacer 22 exposes sidewall surfaces of the ILD layer 26 and the raised source/drain (S/D) structure 24 within the source region and the drain region of the exemplary semiconductor structure.

In some embodiments of the present application and when the dielectric spacer 22 and each second hard mask cap 18P comprise a same material a single etch may be used. In one embodiment, the etch is an anisotropic etch such as a reactive ion etch. In other embodiments of the present application and when the dielectric spacer 22 and each second hard mask cap 18P comprise different materials, two separate etching processing may be used to remove the dielectric spacer 22 and each second hard mask cap 18P. In such an embodiment, the order of removal may vary and is not critical to the present application. As is shown in FIG. 12C, the raised source/drain (S/D) structures 24 and the overlying ILD layer 26 have sidewalls that overhang the sidewalls of the silicon pedestal structures 10L', 10R'.

Figure 13A:
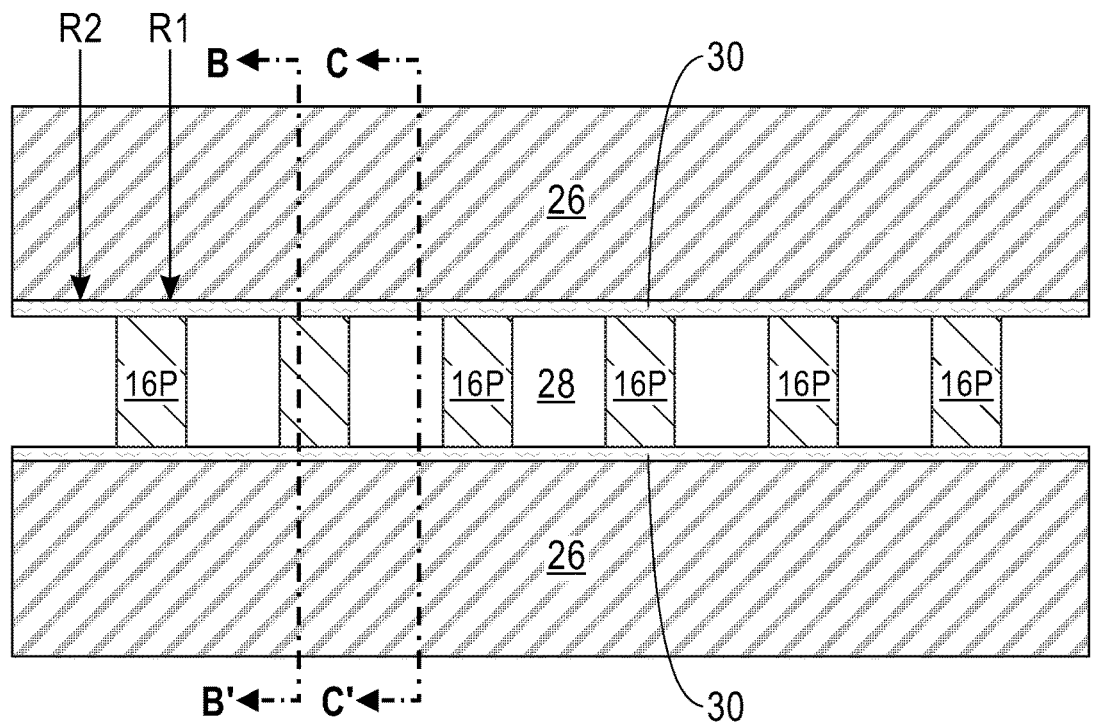
FIG. 13A is a top down view of the exemplary semiconductor structure of FIGS. 12A-12C after forming a gate spacer.
Figure 13B:
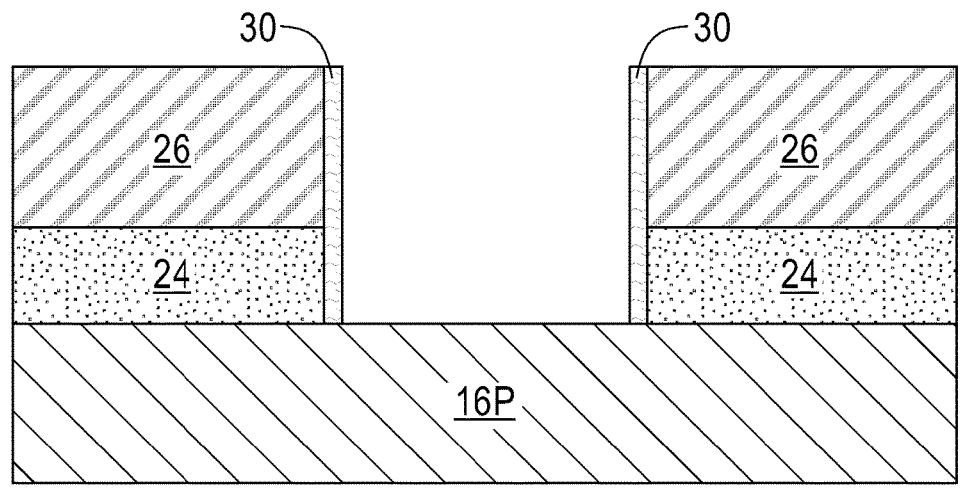
FIG. 13B is a cross sectional view of the exemplary semiconductor structure of FIG. 13A through vertical plane B-B'.
Figure 13C:
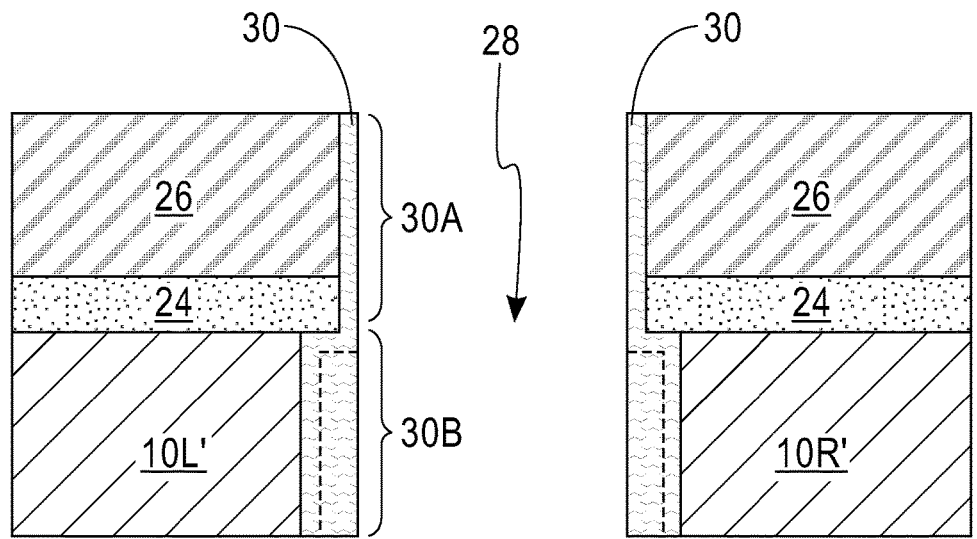
FIG. 13C is a cross sectional view of the exemplary semiconductor structure of FIG. 13A through vertical plan C-C'.

Referring now to FIGS. 13A-13C, there is shown the exemplary semiconductor structure of FIGS. 12A-12C after forming a gate spacer 30. The gate spacer 30 has first regions, R1, that are located on each strained silicon germanium alloy fin 16P. See, for example, FIG. 13B. The gate stack 30 also has second regions, R2, that are present adjacent each strained silicon germanium alloy fin 16P that have an upper portion 30A and a lower portion 30B. See, for example, FIG. 13C. In some embodiments of the present application, the first regions, R1, of the gate spacer 30, and the second regions, R2, of the gate spacer 30 including the upper portion 30A and lower portion 30B have a same thickness. This is shown in FIG. 13C by the dotted line within gate spacer 30 located in the second regions, R2. In another embodiment of the present application, the first regions, R1, of the gate spacer 30 and the upper portion 30A of the gate spacer 30 in the second regions, R2, have a first thickness, and the lower portion 30B of the gate spacer 30 in the second region, R2, has a second thickness that is greater than the first thickness. In either embodiment, the lower portion 30B of the gate spacer 30 has a sidewall surface that directly contacts an exposed sidewall surface of the silicon pedestal structures 10R', 10L'. The lower portion 30B the gate spacer 30 thus fills in the undercut region 29 mentioned above. As is further shown, the upper portion 30A of gate spacer 30 has a sidewall surface in which one portion thereof directly contacts a sidewall surface of the ILD layer 26, while another portion of the upper portion 30A of the gate spacer 30 directly contacts a sidewall surface of the raised source/drain (S/D) structure 24. Within the first region, R1, the gate spacer 30 has a bottommost surface that is coplanar with a bottommost surface of each raised source/drain (S/D) structure 24. In the second regions, R2, the lower portion 30B of the gate spacer 30 has a bottommost surface that is coplanar with a bottommost surface of each silicon pedestal structure 10L', 10R'.

In some embodiments of the present application, the gate spacer 30 may include a dielectric oxide, dielectric nitride and/or dielectric oxynitride. In one embodiment, the gate spacer 30 is composed of silicon dioxide or silicon nitride. In other embodiments of the present application, the gate spacer 30 comprises a dielectric material having a dielectric constant that is less than the dielectric constant of silicon dioxide. In one example, the gate spacer 30 having a dielectric constant less than silicon dioxide may include a material that includes atoms of Si, O, C and H with N being optionally present.

The gate spacer 30 may be provided by a deposition process, followed by etching. The deposition used to provide the gate spacer 30 may include, for example, chemical vapor deposition (CVD), plasma enhanced chemical vapor deposition (PECVD), or physical vapor deposition (PVP). The etch used to provide the gate spacer 30 may comprise a dry etching process such as, for example, reactive ion etching.

Figure 14A:
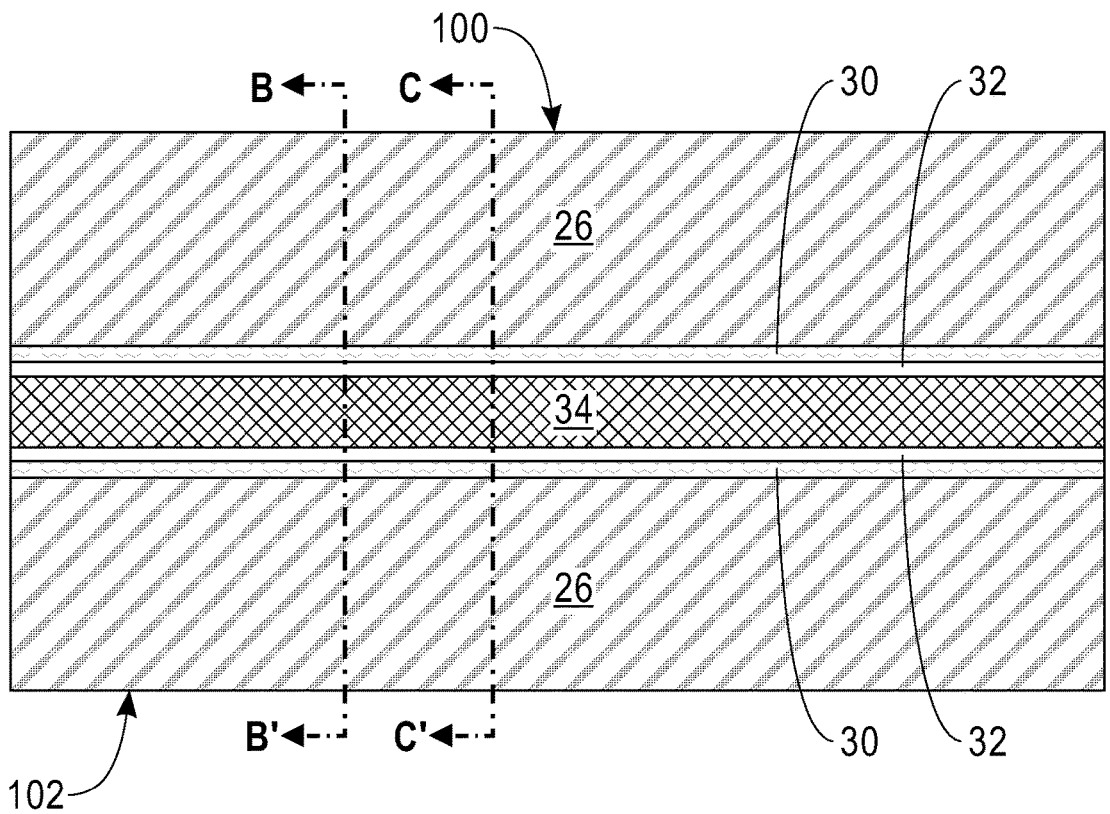
FIG. 14A is a top down view of the exemplary semiconductor structure of FIGS. 13A-13C after forming a functional gate structure.
Figure 14B:
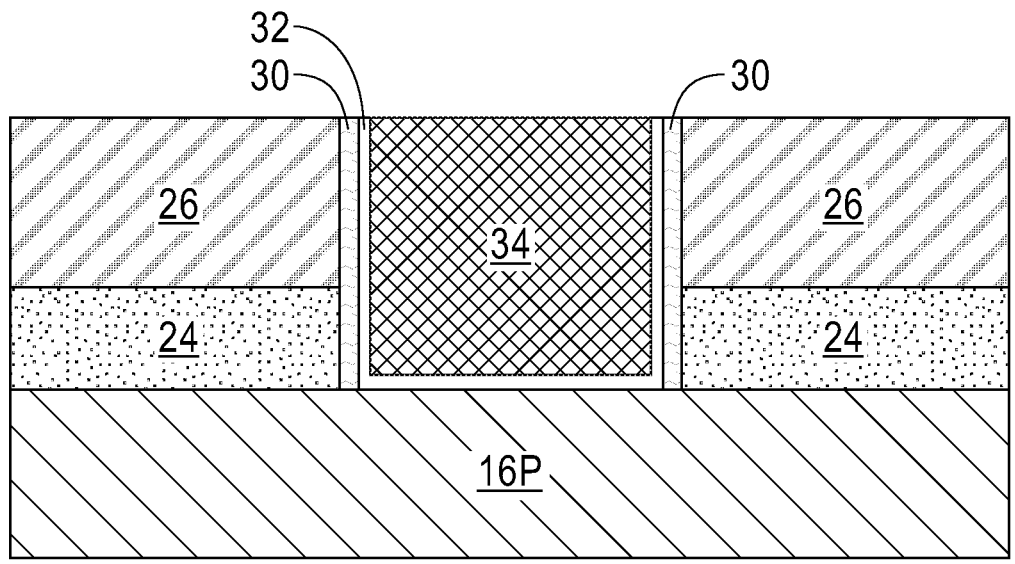
FIG. 14B is a cross sectional view of the exemplary semiconductor structure of FIG. 14A through vertical plane B-B'.
Figure 14C:
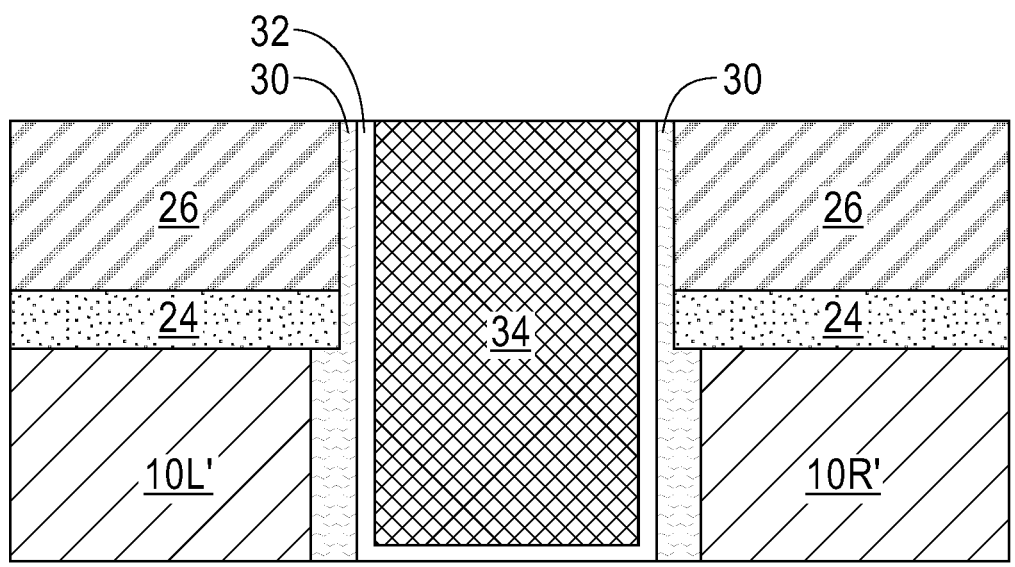
FIG. 14C is a cross sectional view of the exemplary semiconductor structure of FIG. 14A through vertical plan C-C'.

Referring now to FIGS. 14A-14C, there are illustrated various views of the exemplary semiconductor structure of FIGS. 13A-13C after forming a functional gate structure. By "functional gate structure" it is meant a permanent gate structure used to control output current (i.e., flow of carriers in the channel) of a semiconducting device through electrical or magnetic fields. Although not evidence from the top down view shown in FIG. 14A, the functional gate structure has a topmost surface that is coplanar with a topmost surface of the ILD 26 and the gate spacer 30; See, FIGS. 14B and 14C. The functional gate structure may include a gate dielectric portion 32 and a gate conductor portion 34; the topmost surface of each of the gate dielectric portion 32 and the gate conductor portion 34 may be coplanar with a topmost surface of the ILD layer 26. In the present application, the functional gate structure including the gate dielectric portion 32 and the gate conductor portion 34 within the cavity mentioned above straddle the exposed portions of the strained silicon germanium alloy fins 16P. Thus, and within the cavity mentioned above that is formed by removing the sacrificial gate structure 20, the exposed strained silicon germanium alloy fins 16P represent channel regions of the FinFET structure that includes the functional gate structure.

The gate dielectric portion 32 may include a gate dielectric material. The gate dielectric material that provides the gate dielectric portion 32 can be an oxide, nitride, and/or oxynitride. In one example, each gate dielectric material that provides the gate dielectric portion 32 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 32. In some embodiments, the gate dielectric portion 32 of each functional gate structure comprises a same gate dielectric material. In another embodiment, at least one of the gate dielectric portions 32 of at least one of the functional gate structures comprises a different gate dielectric material than the other gate dielectric portions 32 of the other functional gate structures.

The gate dielectric material used in providing the gate dielectric portion 32 can be formed by any deposition process including, for example, chemical vapor deposition (CVD), plasma enhanced chemical vapor deposition (PECVD), physical vapor deposition (PVD), sputtering, or atomic layer deposition. In some embodiments, block mask technology can be used to provide a different gate dielectric material to different functional gate structures. In one embodiment of the present application, the gate dielectric material used in providing the gate dielectric portion 32 can have a thickness in a range from 1 nm to 10 nm. Other thicknesses that are lesser than, or greater than, the aforementioned thickness range can also be employed for the gate dielectric material that may provide the gate dielectric portion 32.

The gate conductor portion 34 can include a gate conductor material. The gate conductor material used in providing the gate conductor portion 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 34 may comprise an nFET gate metal. In another embodiment, the gate conductor portion 34 may comprise a pFET gate metal. In some embodiments, at least one of the gate conductor portions 34 of at least one of the functional gate structures comprises a different gate conductor material than the other gate conductor portions of the other functional gate structures.

The gate conductor material used in providing the gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In some embodiments, block mask technology can be used to provide a different gate conductor material to different functional gate structures. When a metal silicide is formed, a conventional silicidation process is employed. In one embodiment, the gate conductor material used in providing the gate conductor portion 34 can have a thickness from 50 nm to 200 nm. Other thicknesses that are lesser than, or greater than, the aforementioned thickness range can also be employed for the gate conductor material used in providing the gate conductor portion 34.

The functional gate structure (32, 34) can be formed by providing a functional gate material stack of the gate dielectric material, and the gate conductor material. A planarization process may follow the formation of the functional gate material stack.

Notably, FIGS. 14A-14C illustrate a semiconductor structure in accordance with the present application. The semiconductor structure of the present application includes a functional gate structure (32, 34) straddling over a first portion of at least one strained silicon germanium alloy fin 16P. A source region 100 is located on one side of the functional gate structure (32, 34) and comprises, a first end portion of the at least one strained silicon germanium alloy fin 16P, and silicon pedestal structures (e.g., 10L') located on opposing sidewalls of the first end portion of the at least one strained silicon germanium alloy fin 16P. A drain region 102 is located on another side of the functional gate structure (32, 34) and comprises a second end portion of the at least one strained silicon germanium alloy fin 16P, and silicon pedestal structures (e.g., 10R') located on opposing sidewalls of the second end portion of the at least one strained silicon germanium alloy fin 16P. A raised source/drain (S/D) structure 24 is present over each of the silicon pedestal structures 10L', 10R' and the first and second end portions of the silicon germanium alloy fins 16P, wherein each of the raised silicon raised source/drain (S/D) structures 24 has a sidewall surface that overhangs a sidewall surface of the silicon pedestal structure 10L, 10R'. A gate spacer 30 is located on opposing sidewalls of the functional gate structure (32, 34) and separates the functional gate structure (32,34) from the source region 100 and the drain region 102, wherein the gate spacer 30 has a first region, R1, that is located on the at least one strained silicon germanium alloy fin 16P, and the gate spacer 30 has second regions, R2, that are present adjacent the at least one strained silicon germanium alloy fin 16P that have an upper portion 30A and a lower portion 30B, the lower portion 30B of gate spacer 30 fills an undercut region 29 beneath the overhang.

Figure 15A:
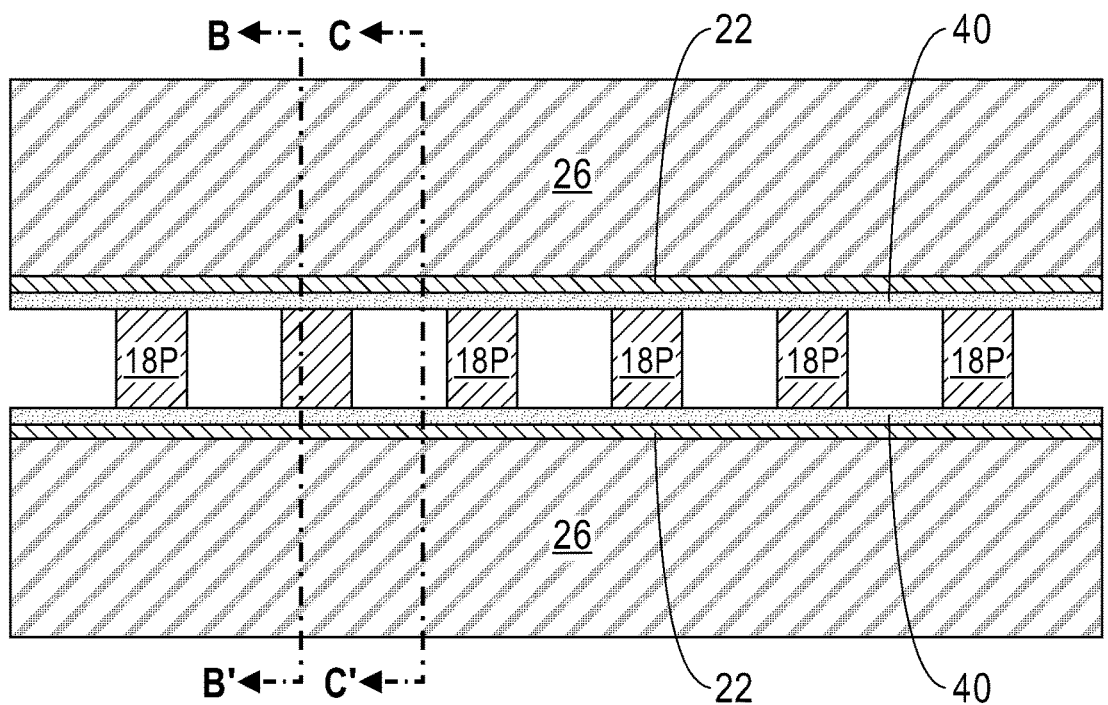
FIG. 15A is a top down view of the exemplary semiconductor structure of FIG. 10A-10C after etching into a sidewall of each remaining silicon pedestal portion located beneath the dielectric spacer and forming a gate spacer.
Figure 15B:
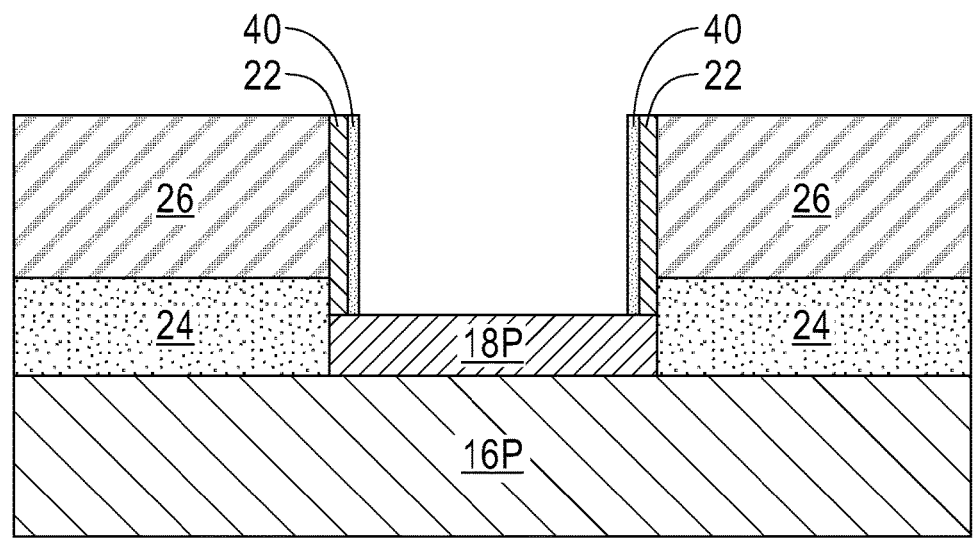
FIG. 15B is a cross sectional view of the exemplary semiconductor structure of FIG. 15A through vertical plane B-B'.
Figure 15C:
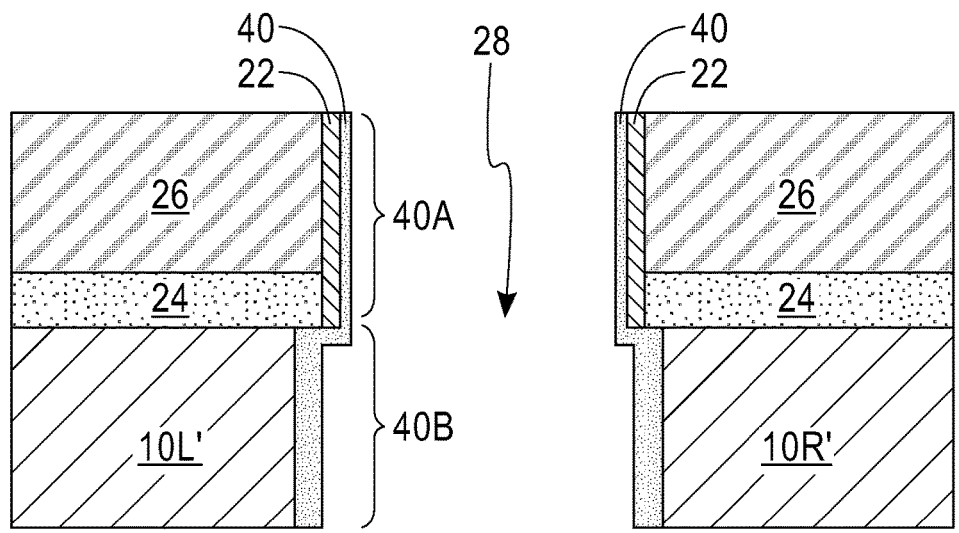
FIG. 15C is a cross sectional view of the exemplary semiconductor structure of FIG. 15A through vertical plan C-C'.

Referring now to FIGS. 15A-15C, there are illustrated through different views, and in another embodiment of the present application, the exemplary semiconductor structure of FIGS. 10A-10C after etching into a sidewall of each remaining silicon pedestal portion 10L, 10R located beneath the dielectric spacer 22, and forming a gate spacer 40.

After etching, portions of each silicon pedestal portion 10L, 10R remain beneath the ILD layer 26 in both the source region and the drain region. The remaining portions of the silicon pedestal portions 10L, 10R can be referred to herein as silicon pedestal structures 10L', 10R'. As is shown, in FIG. 15C, portions of the raised source/drain (S/D) structure 24 and the ILD layer 26 overhang the underlying silicon pedestal structure 10L', 10R'. The etching used to provide the exemplary semiconductor structure shown in FIGS. 15A-15C comprises a directional etch as mentioned above.

After etching, gate spacer 40 is formed. Gate spacer 40 may comprise one of the spacer materials mentioned above for gate spacer 30. Gate spacer 40 may be formed utilizing the technique mentioned above in forming gate spacer 30. The gate spacer 40 has first regions, R1, that are located on each strained silicon germanium alloy fin 16P. See, for example, FIG. 15B. The gate stack 40 also has second regions, R2, that are present adjacent each strained silicon germanium alloy fin 16P that have an upper portion 40A and a lower portion 40B. See, for example, FIG. 15C. In some embodiments of the present application, the first regions, R1, of the gate spacer 40, and the second regions, R2, of the gate spacer 40 including the upper portion 40A and lower portion 40B have a same thickness. In another embodiment of the present application the first regions, R1, of the gate spacer 40 and the upper portion 40A of the gate spacer 40 in the second regions, R2, have a first thickness, and the lower portion 40B of the gate spacer 40 in the second region, R2, has a second thickness that is greater than the first thickness. In either embodiment, the lower portion 40B of the gate spacer 40 has a sidewall surface that directly contacts an exposed sidewall surface of the silicon pedestal structures 10R', 10L'. The lower portion 40B the gate spacer 40 thus fills in the undercut region 29 mentioned above. As is further shown, the upper portion 40A of gate spacer 40 has a sidewall surface directly contacting the dielectric spacer 22 that is present on a sidewall surface of the ILD layer 26 and a sidewall surface of the raised source/drain (S/D) structure 24. Within the first region, R1, the gate spacer 40 has a bottommost surface that is coplanar with a bottommost surface of each raised source/drain (S/D) structure 24. In the second regions, R2, the lower portion 40B of the gate spacer has a bottommost surface that is coplanar with a bottommost surface of each silicon pedestal structure 10L', 10R'.

Figure 16A:
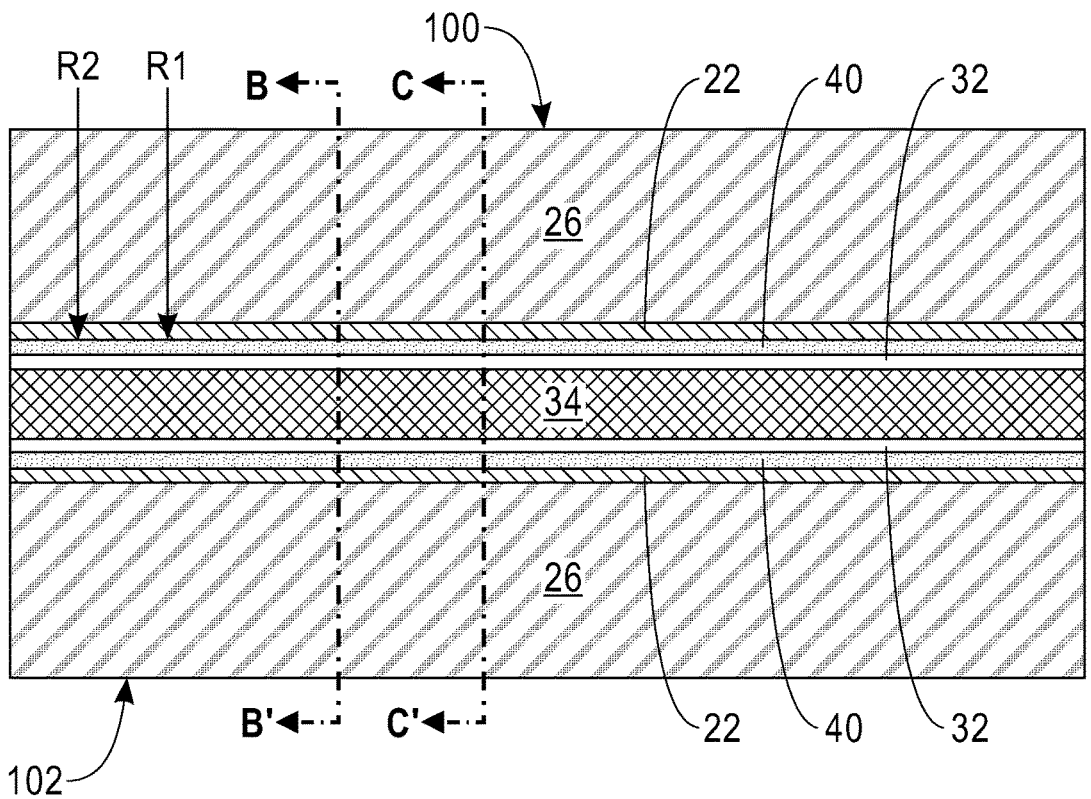
FIG. 16A is a top down view of the exemplary semiconductor structure of FIGS. 15A-15C after forming a functional gate structure.
Figure 16B:
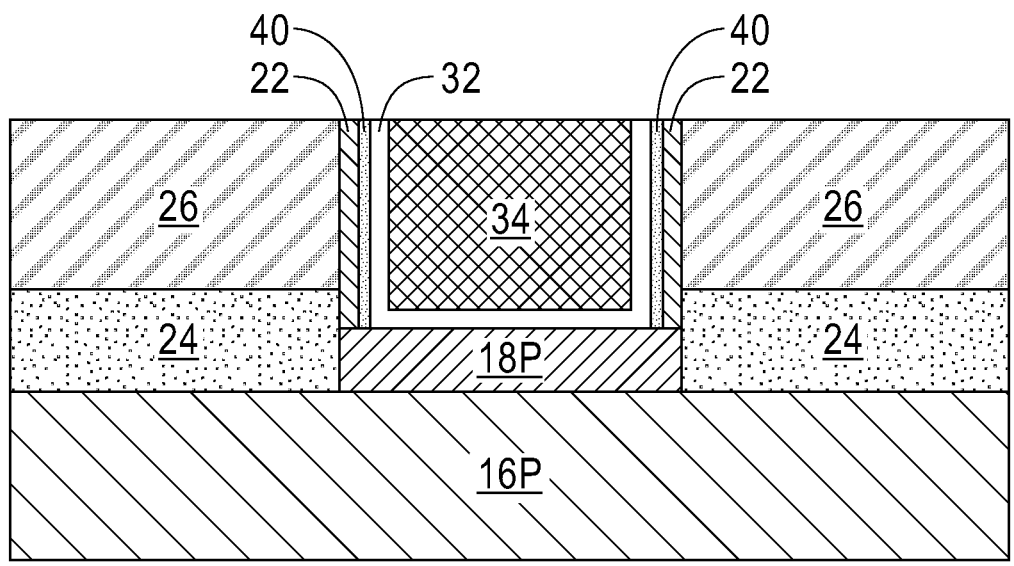
FIG. 16B is a cross sectional view of the exemplary semiconductor structure of FIG. 16A through vertical plane B-B'.
Figure 16C:
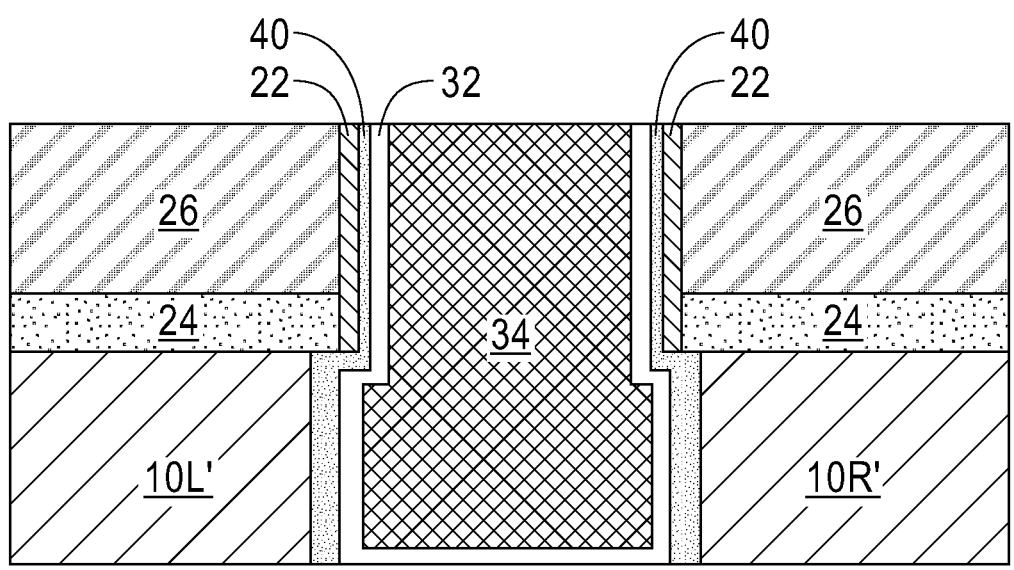
FIG. 16C is a cross sectional view of the exemplary semiconductor structure of FIG. 16A through vertical plan C-C'.

Referring now to FIGS. 16A-16C, there are illustrated various views of the exemplary semiconductor structure of FIGS. 15A-15C after forming a functional gate structure. The functional gate structure of this embodiment of the present is the same as that described above in the previous embodiment shown in FIGS. 14A-14C. The functional gate structure includes a gate dielectric portion 32, as described above, and a gate conductor portion 34, as also described above.

Notably, FIGS. 16A-16C illustrated another exemplary semiconductor structure of the present application which is similar to the one depicted in FIGS. 14A-14C except that gate spacer is now labeled as element 40 and the dielectric spacer 22 remains.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a functional gate structure straddling over a first portion of at least one strained silicon germanium alloy fin;
   a source region located on a source-side of the functional gate structure and comprising, a first end portion of the at least one strained silicon germanium alloy fin, and a source-side silicon pedestals structure located on opposing sidewalls of the first end portion of the at least one strained silicon germanium alloy fin;
   a drain region located on a drain-side of the functional gate structure and comprising, a second end portion of the at least one strained silicon germanium alloy fin, and a drain-side silicon pedestal structure located on opposing sidewalls of the second end portion of the at least one strained silicon germanium alloy fin;
   a first raised source/drain (S/D) structure present on the source-side silicon pedestal structure, wherein the first raised source/drain (S/D) structure has a sidewall surface that overhangs a sidewall surface of the source-side silicon pedestal structure;
   a second raised source/drain structure present on the drain-side silicon pedestal structure, wherein the second raised source/drain structure has a sidewall surface that overhangs the drain-side silicon pedestal structure;
   a source-side gate spacer located on a first sidewall of the functional gate structure, wherein the source-side gate spacer has a first region that is located on the at least one strained silicon germanium alloy fin, and the source-side gate spacer has a second region that is laterally adjacent the at least one strained silicon germanium alloy fin that has an upper portion and a lower portion, the lower portion of the source-side gate spacer fills an undercut region beneath the overhang present in the source-side; and
   a drain-side gate spacer located on a second sidewall of the functional gate structure, wherein the drain-side gate spacer has a first region that is located on the at least one strained silicon germanium alloy fin, and the drain-side gate spacer has a second region that is laterally adjacent the at least one strained silicon germanium alloy fin that has an upper portion and a lower portion, the lower portion of the drain-side gate spacer fills an undercut region beneath the overhang present in the drain-side.

2. The semiconductor structure of claim 1, wherein the lower portion of the source-side gate spacer directly contacts the sidewall surface of the source-side silicon pedestals structure, and the upper portion of the source-side gate spacer directly contacts the sidewall surface of the first raised source/drain structure that overhangs the source-side silicon pedestal structure, and wherein the lower portion of the drain-side gate spacer directly contacts the sidewall surface of the drain-side silicon pedestal structure, and the upper portion of the drain-side gate spacer directly contacts the sidewall surface of the second raised source/drain structure that overhangs the drain-side silicon pedestal structure.

3. The semiconductor structure of claim 2, further comprising an interlevel dielectric layer located on the first and second raised source/drain (S/D) structures, the interlevel dielectric layer having a first overhanging portion located above the source-side silicon pedestal structure and a second overhanging portion located above the drain-side silicon pedestal structure, and wherein the upper portion of each of the source-side gate spacer and the drain-side gate spacer extends to a topmost surface of the interlevel dielectric layer.

4. The semiconductor structure of claim 2, wherein the strained silicon germanium alloy fin has a height that is less than a height of each of the silicon pedestal structures.

5. The semiconductor structure of claim 1, wherein the first region of both of the source-side gate spacer and the drain-side gate spacer has a first thickness, the upper portion of the second region of both of the source-side gate spacer and the drain-side gate spacer has the first thickness and the lower portion of the second region of both of the source-side gate spacer and the drain-side gate spacer has a second thickness, wherein the second thickness is greater than the first thickness.

6. The semiconductor structure of claim 1, wherein the at least one strained silicon germanium alloy fin is present on a surface of a doped semiconductor region of a substrate.

7. The semiconductor structure of claim 1, wherein the sidewall surface of the first raised source/drain (S/D) structure overhangs the sidewall surface of the source-side silicon pedestal structure by a width from 2 nm to 20 nm, and wherein the sidewall surface of the second raised source/drain structure overhangs the sidewall surface of the drain-side silicon pedestal structure by a width from 2 nm to 20 nm.

8. The semiconductor structure of claim 1, wherein the functional gate structure comprises a gate dielectric portion and a gate conductor portion, wherein the gate dielectric portion has a topmost surface that is coplanar with a topmost surface of the gate conductor portion.

9. The semiconductor structure of claim 8, wherein the topmost surface of both the gate dielectric portion and the gate conductor portion is coplanar with a topmost surface of the source-side gate spacer and the drain-side gate spacer.

10. The semiconductor structure of claim 1, wherein each of the source-side gate spacer and the drain-side gate spacer is composed of a dielectric material that includes atoms of Si, O, C and H.

11. The semiconductor structure of claim 8, wherein the gate conductor portion has a constant width.

12. The semiconductor structure of claim 1, wherein the at least one strained silicon germanium alloy fin has a germanium content of from 20 atomic percent to 60 atomic percent.

* * * * *